US006911300B2

(12) United States Patent
Sato et al.

(10) Patent No.: US 6,911,300 B2
(45) Date of Patent: Jun. 28, 2005

(54) PHOTOGRAVURE PLATE MAKING METHOD

(75) Inventors: Tsutomu Sato, Kashiwa (JP); Kaku Shigeta, Kashiwa (JP); Tatsuo Shigeta, Nagareyama (JP)

(73) Assignee: Think Laboratory Co., Ltd., Chiba (JP)

( * ) Notice: Subject to any disclaimer, the term of this patent is extended or adjusted under 35 U.S.C. 154(b) by 0 days.

(21) Appl. No.: 10/703,627

(22) Filed: Nov. 10, 2003

(65) Prior Publication Data

US 2005/0100826 A1 May 12, 2005

(51) Int. Cl.[7] .......................... G03F 7/039; G03F 7/18; G03F 7/30; G03F 7/38

(52) U.S. Cl. ...................... 430/307; 430/327; 430/330; 430/935; 101/153; 427/240; 427/346

(58) Field of Search ............................... 430/307, 327, 430/330, 935; 101/153; 427/240, 346

(56) References Cited

FOREIGN PATENT DOCUMENTS

| | | | |
|---|---|---|---|
| JP | 10-193552 A | | 7/1998 |
| JP | 2001-179924 A | | 7/2001 |
| JP | 2003-320763 | * | 11/2003 |
| JP | 2003-322961 | * | 11/2003 |
| JP | 2004-151630 | * | 5/2004 |
| JP | 2001-179923 | * | 7/2004 |

OTHER PUBLICATIONS

European Search Report dated Apr. 15, 2004.

* cited by examiner

*Primary Examiner*—Richard L Schilling
(74) *Attorney, Agent, or Firm*—Rader, Fishman & Grauer PLLC

(57) ABSTRACT

There is provided a photogravure plate making method capable of performing a quite superior photogravure plate making operation while it has a requisite and sufficient developing latitude under non-heating condition after forming a coating film and while applying a positive O-type thermal resist. The positive-type photosensitive agent composed of an alkaline soluble positive-type photosensitive composition having an infrared wavelength laser sensitivity with a developing latitude under non-heating condition after forming a coated film is coated on the photogravure plated roll to form a photosensitive roll, then a positive image is exposed against the photosensitive film with the infrared wavelength laser, main chain or side chain of molecules of the photosensitive film forming resin at the exposed portion and at the same time, a latent image having a dispersion properly generated at the photosensitive layer is formed, then an alkaline developing is carried out to cause the photosensitive film forming resin at the exposed portion to be washed away and only the resist at the non-image line part is left.

6 Claims, 4 Drawing Sheets

PHOTOGRAVURE PLATE MAKING METHOD

BACKGROUND OF THE INVENTION

1. Field of the Invention

This invention relates to a photogravure plate making method capable of performing a quite excellent photogravure plating under application of a positive-type thermal resist including a requisite and sufficient developing latitude through non-heating operation after forming a coating film.

2. Description of the Related Art

The prior art traditional positive-type photosensitive lithography plate contains novolac resin and o-quinonediazide composition, a substance photosensitive to white light, this plate becomes a ketene structure while producing an Armdt-Eistert type transition through pholysis (chemical change) of o-quinonediazide as indicated in a chemical formula (1) as follows, produces five-membered ring carboxylic acid, ketene at an upper part of photosensitive layer at an exposed portion is reacted with naphthoquinonediazide at the lower part of the photosensitive layer to form lactone, this becomes sodium carboxylic acid while lactone ring is opened when a developing action occurs with alkaline aqueous solution, the coexisting novolac resin also shows elution because it is resoluble with alkali and in turn, the photosensitive layer non-yet exposed portion produces a coupling reaction together with the coexisting novolac resin, it becomes an alkali-resolution retardant and left as a resist image. In this way, if it includes o-quinonediazide composition, a substantial developing latitude can be attained.

In this case, the developing latitude can be defined as one in which a developing operation can be carried out while there is a difference between a time until the exposed portion is exposed to the developing liquid and the exposed portion is completely removed and a time in which a residual film rate at the non-exposed portion is sufficiently assured even if it is exposed to the developing liquid.

[Chemical formula 1]

(1)

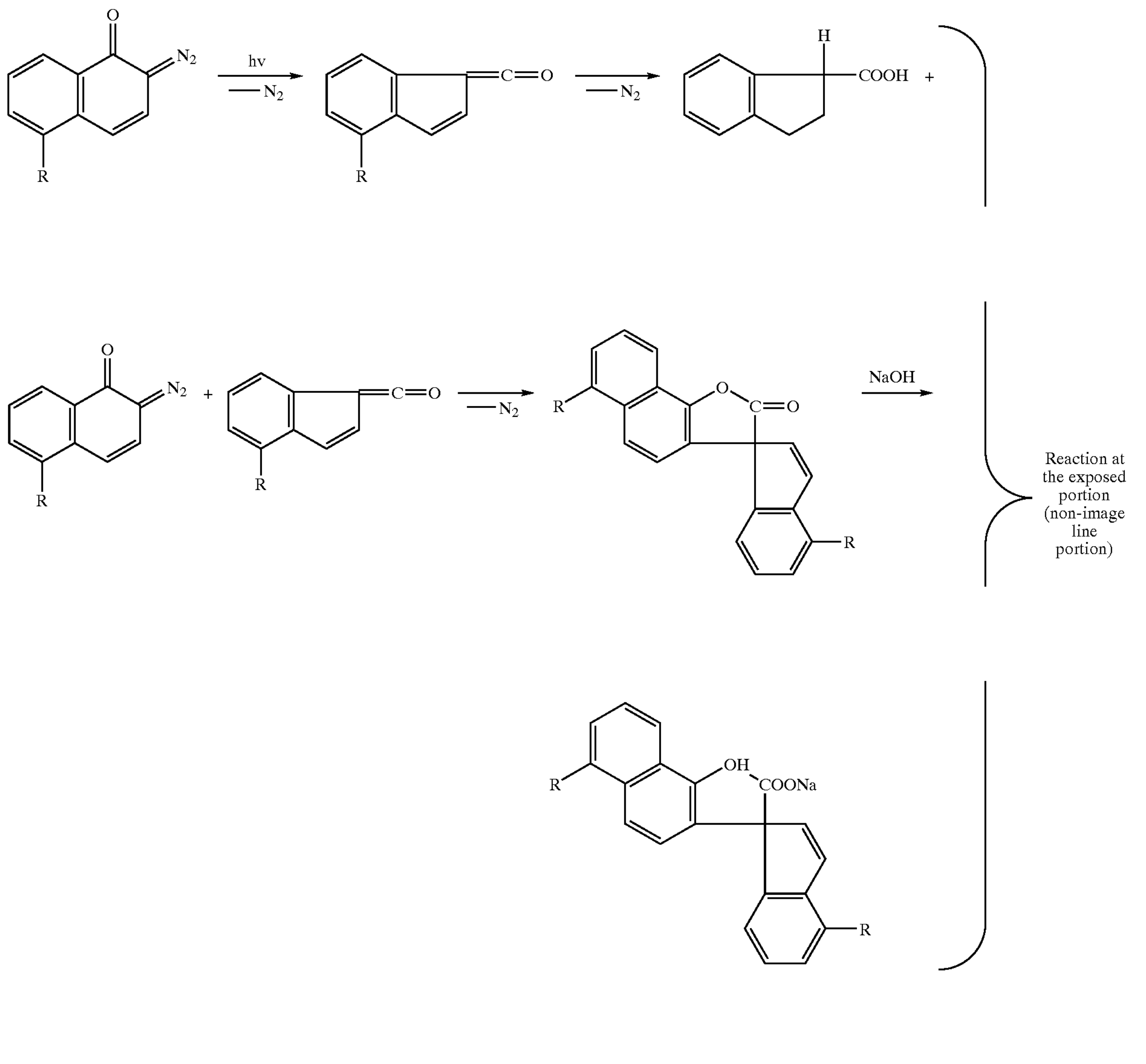

-continued

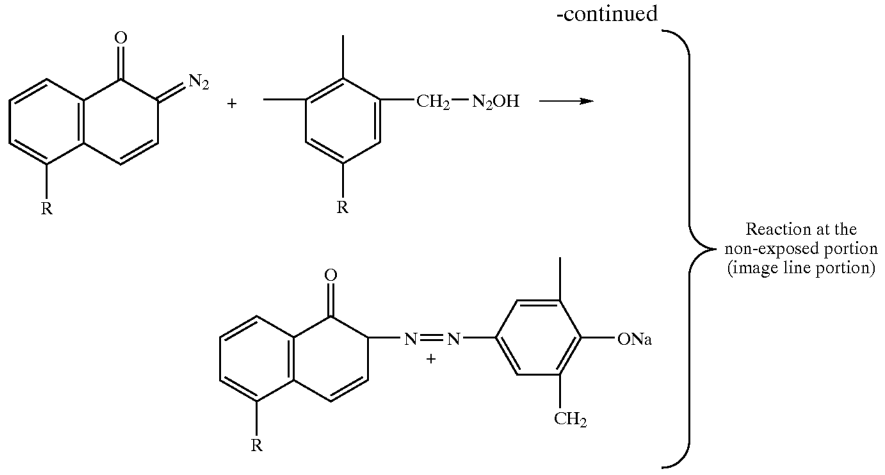

To the contrary, in order to enable a photogravure plate making to be carried out even under white light lamp, a positive-type photosensitive composition utilizing a change other than a chemical change has been invented, there has been devised to provide a method for printing a positive image with a laser light of infrared wave length region, increasing a solubility of the exposed portion against the developer liquid to form a positive image and thus this has been carried out through an offset plate making or a flexographic plate making. As the technical documents; there have been provided the gazettes of Japanese Patent Laid-open Numbers 1998(10)-268,512; 1999(11)-194,504; 1999 (11)-223,936; 1999(11)-84,657; 1999(11)-174,681; 1999 (11)-231,515; WO97/39,894; WO98/42,507; the gazettes of Japanese Patent Laid-Open Numbers 2002-189293; and 2002-189,295 and the like.

The positive-type photosensitive lithography plate described in each of the aforesaid documents has, as its major photosensitive component, substance absorbing infrared ray such as infrared absorbing pigment to convert it into heat and alkaline soluble resin such as novolac resin and the like, and a physical change such as conformation change of resin and the like is generated by heat produced by an infrared laser light exposed light and then solubility against developer liquid is increased.

However, the positive-type photosensitive lithography plate not containing o-quinonediazide composition, printing a positive image with a laser beam in an infrared wavelength range, producing a physical change such as conformation change of resin and the like to increase its solubility requires at present a burning process (a heating operation) after coating a film. Even if the burning process is carried out, a difference in dissolution speed between an exposed part and a non-exposed part is low, basic performances of a printing plate such as sensitivity and developing latitude are poor, so that it is hard to satisfy a stability in developing process when the number of plates for developing process is increased.

In regard to the aforesaid situation, this circumstance is quite different in the photogravure plate making process. In Japan where the photogravure plate making and printing technology has been mostly distributed in the industry, a photogravure plate making method capable of carrying out the photogravure plate making under application of positive-type thermal resist enabling a developing process to be performed under no heating after forming a coated film has not been performed in the prior art at all and there are no patent documents and experiment documents at all.

The photogravure plate making process for a plate-made roll through a corrosive/laser beam plate making method is comprised of loading→degreasing→washing→pickling→washing→ballade processing→washing→balladecopperplating→washing→grinding with a grind stone→washing→coating of photosensitive agent→coating of antioxidant→image printing with infrared laser exposure device→developing→washing→etching→washing→resist peeling→washing→grinding→washing →unloading.

As technical documents disclosing the photogravure plate making process for a gravure plated roll by a corrosive/laser plate making process, some prior art documents can be cited, i.e. Japanese Patent Application Numbers 1998(10)-193551; 1998(10)-193552; Japanese Patent Laid-Open Numbers 2000-062342; 2000-062343; 2000-062344; 2001-179923; 2001-179924; 2001-187440; 2001-187441; 2001-191475; 2001-191476; 2001-260304; 2002-127369; 2002-187249; 2002-187250; 2002-200728; 2002-200729; 2002-307640; and 2002-307641.

All the photogravure plate making processes described in the aforesaid documents are carried out such that a photosensitive film composed of negative-type photosensitive composition agent is coated and the photosensitive film composed of positive-type photosensitive composition agent is not coated. In the prior art etching process, the negative-type photosensitive film is coated on the gravure-plated roll, the coated film is dried and solidified at a room temperature to form the negative-type photosensitive film, a printing is carried out with argon ion laser beam, and the prior art does not form a positive-type photosensitive film on the gravure-plated roll and does not perform a printing of the positive-type photosensitive agent image with a laser beam of infrared wave length.

A high-power semiconductor laser head manufactured by Creo-Scitex Corporation of Canada radiates a laser of infrared wavelength range, and this is installed at an offset printing machine to perform radiation against the positive-type photosensitive composition, a superior developing can be carried out and so this is practically operated in a world-wide basis.

When a beam diameter of argon ion laser beam and a beam diameter of laser beam with a wavelength of 700 to 1,100 nm are the same value to each other, a resolution of laser at the positive-type photosensitive composition is higher than that at the negative-type photosensitive composition and its processing time can be substantially reduced.

Further, a more superior clear pattern can be attained by the photosensitive film of positive-type photosensitive composition used for printing a negative image with argon ion laser rather than by the photosensitive film of negative-type photosensitive composition used for printing a negative image with argon ion laser. This is caused by a difference in clearness in pattern under a difference in the positive-type photosensitive composition and the negative-type photosensitive composition.

A reason why the positive-type photosensitive composition agent is used for the offset plate making or flexographic plate making in the prior art, but as not been used in the photogravure plate making consists in the fact that the negative-type photosensitive agent could be used in the late photogravure plate making. The negative-type photosensitive agent is material for use in radiating ultraviolet rays to fix a degree of polymerization of resin at the exposed portion, so that whatever material quality at the coated surface may be selected, a requisite and sufficient developing latitude can be assured.

In turn, the positive-type photosensitive composition agent having a developing latitude capable of being satisfied in relation with a copper sulfate plating at the photogravure printing roll was not present at all. In particular, because the photosensitive composition agent not performing any burning after coating was not present at all. Even if the positive-type photosensitive composition agent used in either the offset plate making or flexographic plate making is coated on the gravure-plated roll, a condition capable of forming film is scarcely present. In many cases, the coating film of the positive-type photosensitive composition agent for the photogravure plated roll is entirely flowed by the alkaline developing agent. This is similarly applied even in the case that the burning is carried out after coating.

A photogravure plate making system of high resolving power using the positive-type photosensitive film under application of either a semiconductor laser or YAG laser or the like capable of highly outputting a laser beam of infrared wavelength range is highly desired for its realization in reference to a small-sized device, an environmental light at the time of plate making operation, a resolving power and a clear pattern and the like as compared with the case in which an argon ion laser is used.

The present inventors et al. have started to develop the positive-type photosensitive composition agent having a requisite and sufficient developing latitude without performing any burning after coating in relation with the copper sulfate plating of a photogravure printing roll in view of the aforesaid circumstances.

Then, the present inventors et al. have made undiluted solution of the positive-type photosensitive composition mixed with novolac resin and cyanine pigment in reference to the etching process applied as one of the plate making methods for a photogravure printing roll and coated the positive-type photosensitive agent thinned by the solvent to the copper sulfate plating surface of the photogravure plated roll to form it. In the case of coating of the positive-type photosensitive agent, a photosensitive film coating device according to Japanese Kokoku Publication No. 1995 (07)-109511 (manufactured by Think Laboratory Co., Ltd.) was used. Then, a laser of infrared wavelength range was radiated by an infrared laser exposing device (manufactured by Think Laboratory Co., Ltd.) having a high output semiconductor laser head of Creo-Scitex Corporation mounted therein to print the positive image, a developing test was carried out, resulting in that the photosensitive film was entirely removed and a satisfactory resist image could not be attained at all.

Evaluation of a formed film made by the photosensitive film coating device in accordance with Japanese Kokoku Publication No. 1995 (07)-109511 showed that this prior art device is a spiral scanning system of contact coating type where the coating roll is immersed in the photosensitive agent in the tank, the photosensitive agent is coated by several times against the coated surface and it can be assumed that air is mixed with the photosensitive film, the tank is an opened structure, so that solvent in the photosensitive agent stored in the tank is evaporated to remove evaporating latent heat, the coating roll is cooled to generate a coating of whitening phenomenon, a concentration of the solvent is always decreased, viscosity is gradually increased and a coated film of uniform film thickness cannot be attained. As a result, the present inventors have concluded that the positive-type photosensitive agent film is quite improper even if the negative-type photosensitive agent is properly coated and the photosensitive film coating device according to Japanese Kokoku Publication No. 1995 (07)-109511 makes a film.

In view of the foregoing, the present inventors have replaced with the photosensitive film coating device according to Japanese Kokoku Publication No. 1995 (07)-109511 and developed a photosensitive film coating device in which the solvent in the photosensitive agent in the tank is not evaporated in its sealingly closed state, the material can be coated on the gravure plated roll under no contacted state, and the coating accompanying with the whitening phenomenon can be avoided.

The photosensitive film coating device will be described in detail in the column of the preferred embodiment of the present invention.

In brief, as a method for coating the positive-type photosensitive agent to a gravure plated roll, the upper end of the photosensitive agent flowing-out pipe acting as a vertical pipe is approached to a lower surface of one end of the gravure plated roll chucked at both ends in a horizontal state and rotated, the photosensitive agent is supplied to overflow while being slightly bulged out at the upper end of the photosensitive agent flowing-out pipe, the photosensitive agent flowing-out pipe is moved from one end of the gravure plated roll to the other end thereof, the coating liquid is coated on the gravure plated roll by a spiral scanning system and the rotation of the roll is continued until the coated film shows an automatic drying.

In view of the foregoing, our continued study showed that a strong close contacted state of the positive-type photosensitive composition against the copper sulfate plated surface could not be attained and its developing operation caused the positive-type photosensitive composition to be rapidly eliminated with alkaline developing liquid for all the image lines and non-image lines.

Due to this fact, it could not be avoided that the burning operation for heating the film surface up to a high temperature after film coating is carried out and a close contacting force is applied.

A reason why it was necessary to perform the burning operation consisted in the fact that a film is not formed due to a quite poor close fitness of the positive-type photosensitive composition against the copper sulfate plating surface and the burning operation after film forming enables a hydrogen bond of alkaline soluble organic high molecular substance having a phenolic hydroxyl group to be increased and a close fitness to be improved.

Our continued study under an assumption that the burning operation is carried out at present showed that the positive-type photosensitive composition having the aforesaid manufactured novolac resin and cyanine pigment mixed to each other was coated on the gravure plated roll, the burning was carried out for 30 minutes to cause a film surface temperature to become 60° C., it was exposed with laser and developed, resulting in that a poor developed state was attained.

Thus, burning was carried out for 30 minutes in such a way that the film surface temperature becomes 130° C. Even under this state, a poor phenomenon occurred in which the image line as well as non-image line is entirely removed.

The present inventors concluded that a cause for producing a poor developed state even under performing the burning operation consisted in a too lower close fitness of the positive-type photosensitive composition against the copper sulfate plating.

Thus, as a result of increasing a close fitness force at the photosensitive film through inputting silane coupling adent as promoter for increasing a close fitness force to the positive-type photosensitive composition, both exposure and developing could be carried out in a little superior manner.

More practically, the gravure plated roll with a diameter of ϕ200 mm, for example, was rotated at a low speed of 25 r.p.m., the positive-type photosensitive agent was coated on it, its rotation was continued not to cause any liquid dripping, the photosensitive film having a degree of dry where the solvent is gasified to a state in which no liquid dripping occurs upon elapsing by 5 minutes under a natural drying condition was set, and after this operation, a residual concentration of solvent upon burning at 130° C. for 30 minutes was lower than 2%, the image could be printed by a laser and its developing operation could be carried out.

However, a close fitness against the film could be said as the best one and both exposure and developing did not exceed a little bit superior range.

In addition, it became apparent that when the film surface temperature was set to 130° C., the burning and its subsequent cooling required a time more than 100 minutes, a large amount of heat energy was required, its running cost was high and it showed a poor practical characteristic.

Additionally, when the film surface temperature was set to 130° C., hydrogen bond of alkaline soluble organic high molecular substance having a phenolic hydroxyl group was strengthened to cause a developing to be hardly carried out and at the same time, it was sensed from a poor clearness of pattern that cyanine pigment was denatured and its sensitivity was lowered.

Then, a superior observation about the resist image made it apparent that many pinholes were generated. In the case of the negative resist image, such pinholes as above were not produced. Reasons in regard to these phenomena consisted in the facts that a mere washing with water after precision grinding by a grinder stone did not enable ground powder adhered to the gravure plated roll to be completely washed away; if the plate making room was not made as a clean room of high degree, the powder dusts were adhered to the gravure plated roll during its transporting operation; and the positive resist image was more quite sensitive to the film making condition than that of the negative resist image.

Thus, occurrence of pinholes could be restricted by applying an sufficient wiping-off operation with a wiping cloth before coating the photosensitive agent to the gravure plated roll in reference to our various kinds of studying.

Next, the present inventors et al. have considered it important that a film surface temperature is lowered to eliminate a problem of specific heat capacity because as the photogravure plated rolls, there are present two types of rolls, i.e. one roll having aluminum as its base material and the other roll having iron as its base material, and additionally, their roll diameters are different from each other and different roll diameters cause their thickness to be entirely different, resulting in that even if they are heated by heater only for the same period of time in reference to a difference in specific heat capacity, heat is transmitted to the roll base materials and a film surface temperature is not always heated to 130° C. and disturbance where the rolls are heated to various different temperatures is produced.

The present inventors considered that the burning operation for substantially decreasing a concentration of solvent can be accomplished even if it is carried out under a far lower temperature than 130° C. by selecting composition showing a superior removal of solvent.

A test for reducing the heating time was carried out, a burning temperature for the film surface was decreased to 80° C. to 100° C. and the burning operation was carried out for 50 minutes, it was confirmed that a concentration of the solvent becomes 6% or less. However, this operation resulted in poor developing state. It has been concluded as its cause that the aforesaid silane-coupling agent cannot attain any requisite and sufficient adhesion.

Then, in place of silane-coupling agent acting as adherence agent, imidazole acting as hardening promoter was tried to be inputted. However, there was no specific change as for the case of silane-coupling agent and a burning temperature at the film surface was also the same as that of the silane-coupling agent.

Subsequently, the present inventors performed an experiment that various kinds of adherence agents are added against undiluted solution of the positive-type photosensitive composition composed of alkaline soluble organic high-molecular substance having phenolic hydroxyl group and photo-thermal converting substance for absorbing infrared rays of an image exposure light source and converting the infrared rays into heat, a photo-sensitive film is formed on the copper sulfate plating roll at a room temperature of 25° C., a test image is exposed by the aforesaid infrared laser exposure device (manufactured by Think Laboratory Co., Ltd.) to develop the film, resulting that a burning temperature for the photosensitive film of the positive-type photosensitive composition added with titanium organic compound could be remarkably decreased.

In the case of the photosensitive film of positive-type photosensitive composition added with titanium organic compound, the film could be made in a superior manner even at a burning temperature of 46° C., its sensitivity became superior and developing operation could be easily carried out.

However, a test not performing any burning operation could not attain any superior film formation and a poor developing occurred.

Even if the burning temperature could be decreased approximately to 50° C., it became a disadvantage in reference to a necessity of performing the burning operation, a necessity of performing a cooling operation after burning operation, taking time and energy for the burning operation and its subsequent cooling operation, an extended length of a device line by a length of the burning device, an increased facility expenditure and an increased running cost. Thus, the present inventors considered that an elimination of the burning operation is a problem to be solved.

Performing a burning operation shows that the roll has a high thermal load differing from that of a thin plate member, it takes 30 to 60 minutes for being heated to a requisite temperature, it takes 50 to 100 minutes or longer for being cooled down to a room temperature and further a uniform control cannot be carried out because these times are made different in reference to a size of the roll. In addition, performing the burning operation causes the cyanine pigment to be denatured, its sensitivity to be decreased, a clear pattern to be deteriorated, a thickness of the resist to be thinned at the time of developing operation, its contour to be retracted and a cause of producing some pinholes to be generated.

Accordingly, a development of the positive-type photosensitive film not requiring any burning operation has been highly desired.

As a result of repetition of tests performed by several times, a high total concentration of residual solvent such as MEK, IPA, PM and the like at the time of making a film clarified that an image cannot be printed by a laser (either a principal chain or a side chain of molecules of photosensitive film forming resin at the exposed part is cut to cause them to become low molecules showing a more increased alkaline solubility and at the same time, a latent image under a state where the photosensitive layer is properly dispersed cannot be formed).

A residual concentration of solvent when the positive-type photosensitive agent was coated on the copper sulfate plating plate and upon elapsing of 15 minutes under a natural drying condition where no air blowing was carried out at a room temperature of 25° C. was 11%, and a residual concentration of solvent upon elapsing of 25 hours was 9%. Result of measurement upon elapsing of 10 minutes in which the positive-type photosensitive agent was coated on the photogravure plated roll rotated at 45 r.p.m. showed that a residual concentration of the solvent was merely decreased down to 7%.

Accordingly, in order to modify quality by containing promoter enforcing adherence power in the positive-type photosensitive agent, remake undiluted solution of the positive-type photosensitive film not requiring any burning operation and confirm its result through exposure and developing, it has been found apparent that it is necessary to devise in advance a technology capable of substantially reducing a residual concentration of solvent in compliance with the foregoing.

Then, the present inventors et al., for the first time set, as a theme of development, a practical application of the positive-type photosensitive film not requiring any burning operation, discriminated as a technical concept, both developments, i.e. one development of a film making and drying technology capable of substantially reducing a residual concentration of solvent in a short period of time and easily by another means not dependent on the burning operation after film formation, and the other development of the positive-type photosensitive film capable of substantially improving an adherence characteristic of the positive-type photosensitive film itself through adding of promoter strengthening the adherence power and showing a high developing latitude, and then continued the study so as to solve the former problem at first.

The present inventors have considered the fact that solvent volatilizes from the coated film. It is considered that a dispersion characteristic of the solvent present at the inner layer is decreased as the time elapses and the surface is dried more and more because the coated film contacts air to dry from its surface and increase its hardness and its tissue is fastened. In turn, it is considered that a degree in which the solvent volatilizes from the coated film is made different by a pressure of surrounding atmosphere, a degree of volatilization where the solvent volatilizes from the coated film is high under a negative pressure and the residual solvent can be effectively reduced. However, it is not possible to place the roll having a film coated thereon in a room vacuumed by a vacuum pump.

In view of the foregoing, the present inventors et al. rotated the photogravure plated roll at a high speed after no liquid dripping at the coated film and found that a residual concentration of the solvent can be decreased to 3% or less within a short period of time.

In view of the foregoing, the photogravure plated roll was supported at both ends in a horizontal state in the photosensitive film coating device in accordance with Japanese Patent Publication No. 1995(7)-109511, rotated at a predetermined low speed, test photosensitive liquid was uniformly coated by a spiral scan and non-contact coating system, the rotation was continued after this operation, the photosensitive film with such a degree of drying as one in which the solvent is volatilized not to cause any liquid dripping was set.

Subsequently, as a technology capable of substantially decreasing a concentration of solvent within a quite short period of time without performing any burning operation, the present inventors et al. have established a technology for attaining a formed film having a lower residual concentration of solvent capable of realizing an image printing characteristic with laser beam while the residual solvent in the film is dispersed and removed into air by rotating the photogravure plated roll at a predetermined high speed for a predetermined time, acting a centrifugal force against the residual solvent in the film and frictionally contacting the film surface with air.

Photosensitive liquid was uniformly coated on a test roll of ϕ 200 mm, its rotation was continued at 25 r.p.m. for 5 minutes upon completion of coating operation, and after this, the rotation was stopped, it was waited for 5 minutes, liquid dripping was observed, no liquid dripping was confirmed by naked eyes, the test roll was rotated at 100 r.p.m. for 20 minutes and stopped, a residual concentration of solvent in the photosensitive film was measured and its value was 2.3%.

Further, the technology capable of substantially decreasing the concentration of solvent within a quite short period of time without performing any burning operation has been developed, resulting in that the promoter for enforcing various kinds of adherence power was added, the positive-type photosensitive agent was exposed and developed and a study was continued whether or not the agent has a developing latitude.

As a result, titanium organic compound of at least one of cellulose derivative, titanium alkoxide, titanium acrylate, or titanium chelate was included in undiluted solution of positive-type photosensitive composition composed of alkaline soluble organic high-molecular substance having phenolic hydroxyl group and photo-thermal conversion substance for absorbing infrared rays of the image exposure light source and tested, resulting in that a burning processing caused a poor developing operation, no burning operation caused a superior developing state and the most superior resist pattern could be attained. At this time, a room temperature was 25 to 27° C. and a humidity was about 50 to 55%.

However, test carried out at a day having the highest air temperature of about 16° C. and a quite low humidity of 21 to 23% showed that the photosensitive film was entirely removed through developing operation.

It is known in the industry in general that the positive-type photosensitive agent has a humidity dependency in which it may generate a whitening phenomenon at a high humidity of 60% or more and a film cannot be formed.

However, the aforesaid result clarified that an adherence power of the positive-type photosensitive agent does not appear even under a low air temperature and a quite low humidity. Further, a reason why the whitening phenomenon is generated and a film cannot be formed could not be resolved.

Thus, a dehumidifier and a humidifier were installed in a casing of a photosensitive film coating device according to the aforesaid Japanese Patent Publication No. 1995(7)-109511 so as to control a humidity, subsequently, material for enforcing an adherence power more was completely searched, a small amount of material was added to form a film and a test for exposing and developing the film was carried out in sequence, resulting in that each of the positive-type photosensitive agents in which any of adherence characteristic reforming agents of (1) polyvinyl/polypyrrolidone/polyvinylacetate copolymers (2) polyvinylbutyral (3) styrene/maleic acid copolymers (4) vinylpyrolidone/dimetylaminoetylmethacrylate copolymers (5) terpolymer of vinylpyrrolidone/caprolactam/dimetylaminoetylmethacrylate (6) terpenephenolic resin (7) alkylphenolic resin (8) polyvinylformar resin (9) melamine/formaldehyde resin

(10) polyvinyl acetate, and

(11) ketone resin is mixed with and added with undiluted solution of alkaline soluble organic high molecular substance including epoxy resin having phenolic hydroxyl group or reacted with phenolic hydroxyl group and photo-thermal conversion substance for absorbing infrared rays of an image exposing light source and converting it into heat showed a high developing latitude.

Describing it in detail, the photogravure plated roll of ϕ200 mm plated with copper sulfate was supported at both ends at a photosensitive film coating device and rotated at 25 r.p.m. under a condition in which a room temperature in an experiment room was 25° C. and a humidity in the casing of the photosensitive film coating device was changed to 25%, 30%, 55% and 60%, respectively, the roll was wiped off with a wiping cloth, the positive-type photosensitive agent was correspondingly coated, and also after completion of coating operation, the rotation was continued to prevent liquid dripping from being carried out, the film was formed upon elapsing of 5 minutes under a natural drying condition, and then the roll was rotated at 100 r.p.m. for 10 minutes, the residual solvent was reduced and its rotation was stopped.

All the photogravure-plated rolls taken out of the photosensitive film-coating device could be attained as tested rolls having luster, coated and formed with a quite hard photosensitive film showing luster and having quite high adherence power.

Film thickness of the resist was about 3.5 to 3.8 μm. Measurement of a residual concentration of solvent showed that all the test rolls showed about 2.3%.

Then, the test image was exposed (the image lines were exposed) with a laser of infrared wavelength range by the aforesaid infrared laser-exposing device (manufactured by Think Laboratory Co., Ltd.), then it was developed with alkali, resulting in that non-image line part generated a film reduction dissolved out. However, in all the cases, a quite sharp resist pattern having no residues was attained when it was immersed in the alkali developing liquid for 60 to 70 seconds. Then, it could be confirmed that the resist pattern naturally dried after elapsing a certain time upon developing action is quite hard. A film thickness of the resist film after developing operation was about 1.8 to 2.5 μm. No pinholes caused by the film reduction were generated.

With the foregoing, the present invention has been developed.

SUMMARY OF THE INVENTION

The present invention has been invented in reference to the aforesaid circumstances, and it is an object of the present invention to provide a photogravure plate making method capable of performing a quite superior photogravure plate making operation having a requisite and sufficient developing latitude under non-heated condition after forming a coated film by applying a positive-type thermal resist.

The invention described in claim 1 provides a photogravure plate making method characterized in that an upper end of a coating pipe acting as a vertical pipe is placed near below one end of a photogravure plated roll chucked at both ends in a horizontal state and rotated, said coating pipe is moved up to the other end of the photogravure plated roll, positive-type photosensitive agent composed of alkaline soluble positive-type photosensitive composition having an infrared wavelength range laser sensitivity with a developing latitude where image line part exposed by the alkaline developing liquid is washed away and a non-image line part not exposed is not washed away under non-heating after forming a coated film at one end is slightly bulged out and overflown of an upper end of said coating pipe, the photogravure plated roll is coated through a spiral coating system, also upon completion of coating operation, the rotation of the photogravure plated roll is continued to form a natural dried coating film, then the photogravure plated roll is rotated to show a desired high speed, the residual solvent in the coated film is dispersed into air to reduce a concentration of the residual solvent and to form a photosensitive film, and subsequently, a positive image is exposed with an infrared wavelength range laser against the photosensitive film, either main chain or side chain of the molecules of photosensitive film forming resin at said exposed part is cut to cause it to become a lower molecule having more increased alkaline solubility, a latent image having a photosensitive layer ablation is formed, then alkaline development is carried out, the photosensitive film forming resin at the exposed part is washed away to leave only the resist at the non-image line.

The invention described in claim 2 provides a photogravure plate making method according to claim 1 characterized in that said positive-type photosensitive composition includes alkaline soluble organic high molecular substance including epoxy resin having phenolic hydroxyl group or reacted with phenolic hydroxyl group and photo-thermal conversion substance for absorbing infrared rays of an image exposing light source and converting it into heat, and as adherence characteristic reforming agents, the composition includes any one of (1) polyvinyl polypyrrolidone/polyvinylacetate copolymers (2) polyvinylbutyral (3) styrene/maleic acid copolymers (4) vinylpyrolidone/dimetylaminoetylmethacrylate copolymers (5) terpolymer of vinylpyrrolidone/caprolactam/dimetylaminoetylmethacrylate (6) terpenephenolic resin (7) alkylphenolic resin (8) polyvinylformar resin (9) melamine/formaldehyde resin

(10) polyvinyl acetate, and

(11) ketone resin.

The invention described in claim 3 provides a photogravure plate making method according to claim 1 characterized in that a surface of the photogravure plated roll is wiped off to clean with a wiping cloth before the positive-type photosensitive agent is coated on the photogravure plated roll.

The invention described in claim 4 provides a photogravure plate making method according to claim 1 for making a plated surface characterized in that a surface of the photogravure plated roll for forming a photosensitive film by coating said positive-type photosensitive agent is copper, copper sulfate plating, nickel plating, nickel alloy plating or zinc plating.

The invention described in claim 5 provides a photogravure plate making method according to claim 1 for making a plated surface characterized in that said alkaline developing operation is carried out to wash away the photosensitive film forming resin at an exposed part and to leave only the resist at the non-image line part, and an etching is then carried out to form a cell and subsequently, the resist is peeled off with stronger alkaline developing liquid.

The invention described in claim 6 provides a photogravure plate making method according to claim 1 for making a plated surface characterized in that the plated surface has a hard film for applying plate wear such as a chromium plating or a nickel alloy plating enabling a quenching or ceramics and the like after said resist is peeled off.

In accordance with the photogravure-plated plate making method described in claims 1 to 6, a requisite and sufficient adhesion can be assured under non-heating state after forming a coated film, a concentration of the solvent in the photosensitive agent can be substantially reduced within a short period of time by a quite low energy as compared with that of burning operation and thus the positive-type image can be exposed with the infrared laser, the main chain or side chain of molecules of the photosensitive film forming resin at the exposed part can be cut to cause the molecules to become low molecules for increasing alkaline solubility more and at the same time the dispersion of the photosensitive layer can be properly generated, a film formation of the positive-type thermal resist having a requisite and sufficient developing latitude can be positively formed and a quite superior photogravure plate making by a laser plate making process can be carried out.

In accordance with the photogravure plate making method described in claim 1, a concentration of the solvent in the photosensitive agent can be set constant, coating can be carried out under no-contact state against the plated roll without being contact with air and whitening phenomenon is not accompanied with it.

In accordance with the photogravure-plated plate making method described in claim 3, occurrence of pinholes not formed with any photosensitive film can be avoided because either stains or oil and fat adhered to the plated roll can be completely wiped off.

In accordance with the photogravure-plated plate making method described in claim 5, it can be applied to the case where the number of printing sheet is less in a length because the surface of the plated roll is chromium plated, or nickel alloy plated. In accordance with the photogravure plate making method described in claim 6, it can be applied form the case of less number of printing sheets to the case of large number of printing sheets because the surface of the plated roll is chromium plated.

DETAILED DESCRIPTION OF THE PREFERRED EMBODIMENTS

Figure 1:
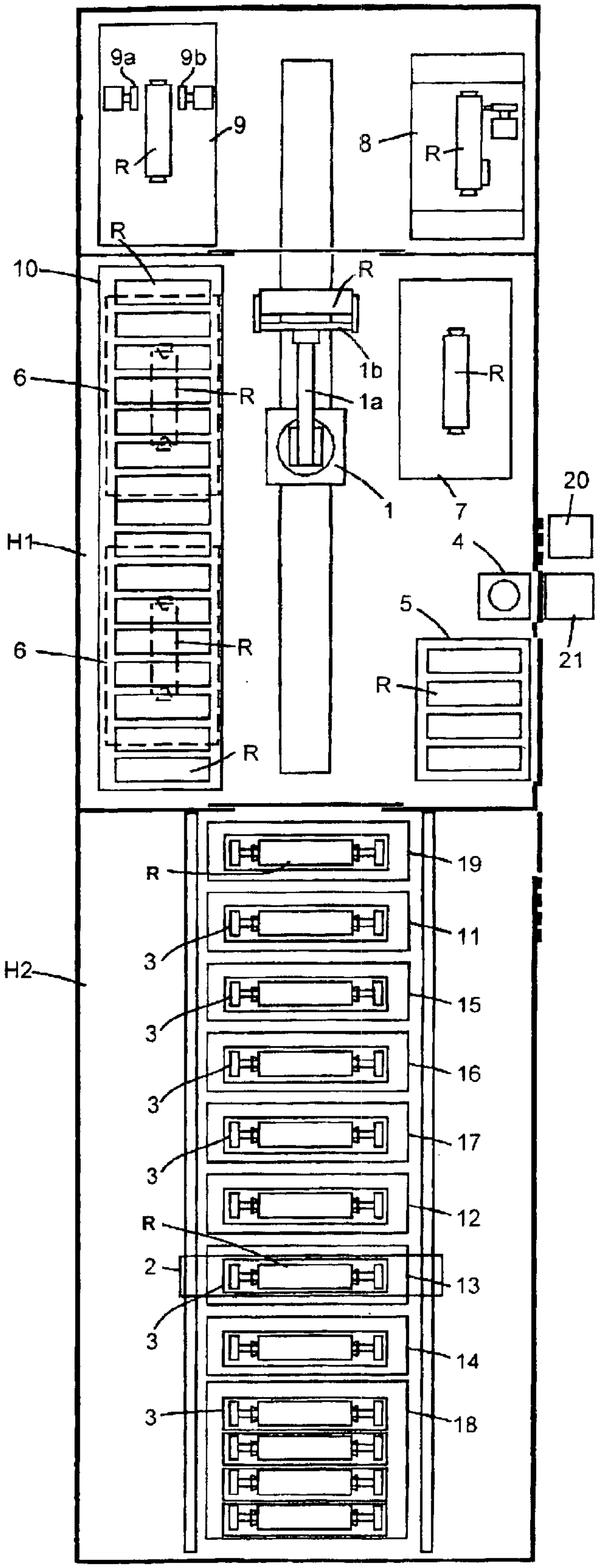
FIG. 1 is a schematic top plan view for showing a photogravure plate-making device for performing a photogravure plate making method.

Referring to the drawings, the photogravure plate making method of embodiments where all the inventions described in claim 1 to claim 6 are included will be described as follows.

At first, a photogravure plate-making factory will be described entirely.

As shown in FIG. 1, the photogravure plate-making factory is divided into two segments of a plate-making room H1 and a plate-making room H2. The plate-making room H1 is set as a handling area for an industrial robot 1, and the plate-making room H2 is set as a transporting area for a stacker crane 2.

As the industrial robot 1, a running-type industrial robot run on a track and enabled to reciprocate and turn in a range of 360° is employed, and has a robot arm 1*a* which can be oscillated in a vertical direction and rotated to be turned around an arm shaft. The robot hand 1*b* installed at the robot arm 1*a* has a handling function for holding both end surfaces of a gravure plated roll R or supporting the shafts at both ends and delivering the photogravure plated roll R between it and another device.

The stacker crane 2 is constructed such that it can lift up a roll fixing/removing rotating device 3 and transport it. The roll fixing/removing rotating device 3 is constructed such that axial holes at both end surfaces of the sleeve-shaped photogravure-plated roll R are fitted and held by a pair of opposing conical chuck cones, an outside part of each of the conical chuck cones is sealingly closed by a water-proof cap, or axles at both ends of the photogravure plated roll R having axles are received at a pair of opposing sleeve chucks, outside portions of the sleeve caps can be sealingly closed by the water-proof cap, and further when the roll is hung down into the main body of the plating device and mounted there, the photogravure plated roll R can be rotated and a plating current can be flowed as required.

The industrial robot 1 in the plate making room H1, and the roll fixing/removing rotating device 3 hang up and transported by the stacker crane 2 in the plate making room H2 are constructed in such a way that the photogravure plated roll R can be directly given and received through an opening arranged at a partition wall between the plate making room H1 and the plate making room H2.

The handling area for the industrial robot 1 in the plate making room H1 has a roll measuring device 4 positioned at a roll loading inlet; a roll loading/unloading device 5 positioned inside a roll loading/unloading door; a photosensitive film coating device 6; an infrared laser exposure device 7; an NC lathe 8; an opposing double-head type grinder 9; and a roll stock device 10. The NC lathe 8 and the grinder 9 use aqueous lubricant or washing water and are partitioned by a partition not influencing against a coating of photosensitive film because the aqueous lubricant or washing water may become a cause for increasing humidity and a cause for generating stain. Two units of photosensitive film coating device 6 are installed in view of a balanced state of processing capabilities.

A roll transporting area for the stacker crane 2 in the plate making room H2 has, in one row, a roll fixing or removing device 19; a surface activating device 11; a nickel plating device 12; a copper sulfate plating device 13; a chromium plating device 14; a developing device 15; a corrosion device 16; a resist image removing device 17; and a stock device 18 for the roll fixing/removing rotating device for use in stocking the roll fixing/removing rotating device 3. The roll fixing/removing rotating device 3 for use in chucking the photogravure plated roll R has a constitution disclosed in the gazette of Japanese Patent Laid-Open No. 1980(55)-164095, for example, and this device is hung by the stacker crane 2, transported by it and installed at the devices 11 to 19.

This photogravure plate-making factory has employed a system in which the NC lathe 8 performs at first a high precision cylindrical machining against a recycled roll, so that no chromium-removing device has been installed at the plate making room H2.

The industrial robot 1 can hold an end surface of the photogravure plated roll R by the robot hand 1*b*. In addition, the aforesaid devices 5 to 9 are operated such that the axial holes at both end surfaces of the sleeve-shaped photogravure plated roll R can be fitted and held by the pair of opposing conical chuck cones, or the axles at both ends of the photogravure plated roll R having axels can be received at the pair of opposed sleeve chucks and the end surfaces can be held. The photogravure plated roll R can be given or received between the industrial robot 1 and each of these devices 5 to 9.

The roll-measuring device 4 performs a measurement of an entire length, outer diameter, hole diameter of the photogravure plated roll and a diameter per every specified pitch from one end to the other end of the roll. Reference numeral 21 denotes a manipulator type roll-handling device, wherein when the photogravure plated roll is mounted on a mounting plate while being raised up, the mounting plate ascends and a door is opened, then the mounting plate is advanced into the plate making room H1 to move the photogravure plated roll to a position where it is chucked with the roll measuring device 4.

The roll loading/unloading device 5 has several to several tens of pallets capable of mounting the photogravure plated roll R and enables the pallets to keep a horizontal state and a desired inclined state. It is preferable to apply the device of Japanese Patent Laid-Open No. 1998-291289, wherein the industrial robot 1 mounts the photogravure plated roll R in advance at the pallet, the pallet is inclined by about 70 to 80° after opening the door, and an operator can raise the photogravure plated roll R in a slant orientation, roll it and take it out of the plate making room H1.

Figure 2:
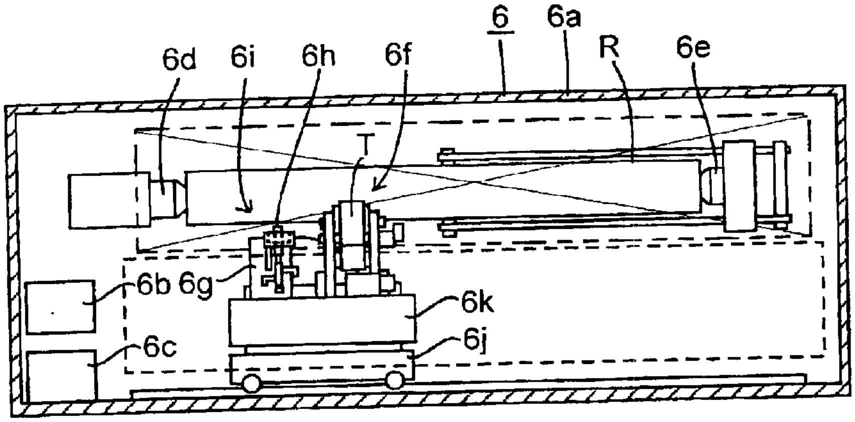
FIG. 2 is a front elevational view for showing a photosensitive film-coating device.

The photosensitive film-coating device 6 is one of the most important devices for carrying out the present invention. Its schematic state is illustrated in FIG. 2. This photosensitive film-coating device 6 is constituted such that a dehumidifier 6*b* and a humidifier 6*c* are installed in the casing 6*a* provided with an opening or closing door device through which the photogravure plated roll R is loaded or unloaded to enable a humidity in the casing to be controlled to a desired value, the photogravure plated roll R can be chucked at both ends in a horizontal state by the pair of opposing chucks 6*d*, 6*e* and at the same time a wiping and washing head 6*f* of a type for feeding out and rool a wiping cloth T from an original roll and a coating head 6*i* for feeding the non-heated positive-type photosensitive agent stored in a tank 6*g* into a vertical pipe 6*h*, overflowing only a requisite amount of agent from the upper end of the pipe and coating it to perform a fountain coat are arranged side by side below the photogravure plated roll R on an ascendable or descendable table 6*k* installed on a running boggy 6*j* in a longitudinal direction of the photogravure plated roll R, the wiping and washing head 6*f* performs a wiping and washing operation from one end to the other end of the photogravure plated roll of 200 ¥mm rotated at 25 r.p.m., for example, the coating head 6*i*, after wiping and washing, performs a coating of the positive-type photosensitive agent from one end to the other end of the photogravure plated roll, and upon completion of coating operation, its rotation is continued for about 5 to 10 minutes at 25 r.p.m., the coated film is naturally dried and subsequently its rotation is continued for 10 minutes at 100 r.p.m., for example, and the residual solvent in the coated film is substantially decreased.

The wiping and washing head 6*f* slides and runs at the circumferential surface of the photogravure plated roll R with a tape T of the wiping cloth so as to wipe off stains or oil and fat adhered to the photogravure plated roll R.

The wiping cloth T is a cloth made of polyester or polyester and nylon of ultra-fine long fibers and having no-self dust generating characteristic. As a preferable wiping cloth, Savina Minimax (a registered trademak) for the wiping cloth of Kanebo Co., Ltd. is present, wherein this is a cloth in which an ultra-fine fiber with 0.1 denier (a thickness of 1 to 5 $\mu$m) is made of polyester and nylon of long fiber, a sectional shape of original thread is a wedge shape, dusts are taken into it and it has no-self dust generating characteristic. In addition, the wiping cloth of Toray Co., Ltd. is a cloth made of ultra fine long fiber of polyester and having no self-dust generating characteristic. This can be applied to the present invention.

The coating head 6*i* is operated such that the upper end of the coating pipe may approach to the lower surface of the photogravure plated roll R with a gap of 500 $\mu$m, for example, the positive-type photosensitive agent overflows at the upper end of the coating pipe while being raised with a surface tension, the agent moves from one end to the other end of the photogravure plated roll R and then the positive-type photosensitive agent can be coated, under no-contact state, on the photogravure plated roll R in a spiral coating system in cooperation with a rotation of the roll.

Details of the positive-type photosensitive agent overflown from the upper end of the coating pipe will be described as follows. This is a positive-type photosensitive agent composed of alkaline soluble positive-type photosensitive composition having an infrared wavelength range laser responding characteristic with a developing latitude under no-heating state after forming the coated film.

In this case, the photosensitive film-coating device may be of a dipping type vertical coating device. Further, it may also be applicable that the photosensitive film coating device is arranged in separate from a wiping and washing device with the wiping cloth and a solvent reducing device for substantially reducing the solvent in the photosensitive film while the photogravure plated roll is rotated at high speed.

The infrared laser exposure device 7 is constructed such that the photogravure plated roll formed with the photosensitive film of the positive-type photosensitive agent is chucked at both ends, rotated and the laser head is approached to one end of the photogravure plated roll and is moved to the other end, a laser beam of infrared wavelength of 700 to 1,100 nm of semiconductor laser is radiated against a portion corresponding to the image line part of the photosensitive film, either a main chain or a side chain of the molecules in the photosensitive film forming resin at the exposed portion is cut to cause them to become low molecules showing a more increased alkaline solubility and at the same time a latent image having photosensitive layer ablation properly generated is formed. That is, it is an unexposed state so as to accommodate for the image line part and a film of the part corresponding to the image line part is dissolved when the alkaline development is carried out to cause the copper metal surface to be exposed.

The NC lathe 8 measures a photogravure plated roll (a re-use roll) of direct plate type and performs a high precision cylinder machining. This cylinder machining is also a lacked plate cylinder machining.

Figure 3:
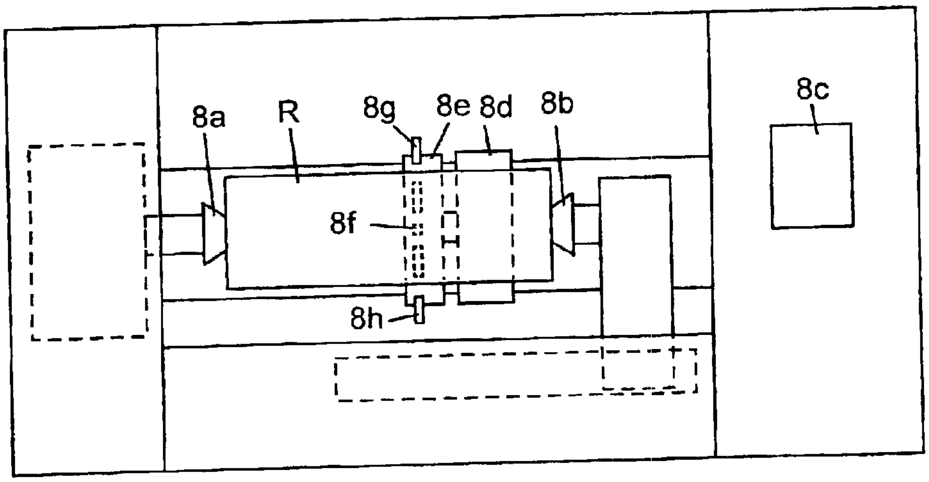
FIG. 3 is a front elevational view for showing an NC lathe.

FIG. 3 is a front elevational view for showing the NC lathe. In this NC lathe 8, an already used direct plate type photogravure plated roll R is chucked at both ends by a conical chuck cone 8*a* arranged at a main shaft and a conical chuck cone 8*b* arranged at a free rotating shaft. Length and outer diameter of the roll measured in advance, an approximate value of a diameter of a chucked hole, a minimum cutting margin and one of the values of plated thickness after machining of a thickness size of copper sulfate plating left after cylinder machining of lacked plate are inputted to a controller 8*c* through a remote communication.

Then, a contact type probe 8*f* installed at a turret type tool rest 8*e* of a double-acting movable table 8*d* is contacted with the roll through multi-points to perform a measurement of radius or the like and carry out a desired calculation to calculate a cutting margin.

As a result of calculation, in the case that a value having said minimum cutting margin added to a difference between a measured maximum radius value and a measured minimum radius value is set as a maximum cutting margin and an allowable cutting margin which is a value having a post-machined plated thickness of a thickness size of the copper sulfate plating left after machining of lacked plate cylinder subtracted from a thickness size of the copper sulfate plating is larger than the maximum cutting margin and/or in the case that an eccentric amount which is a half value of difference between the measured maximum radius value and the measured minimum radius value is smaller than an allowable eccentric amount, the operation is transferred to a machining program and a point of the measured minimum radius value at the roll surface is cut or scraped under the minimum cutting margin.

Figure 4:
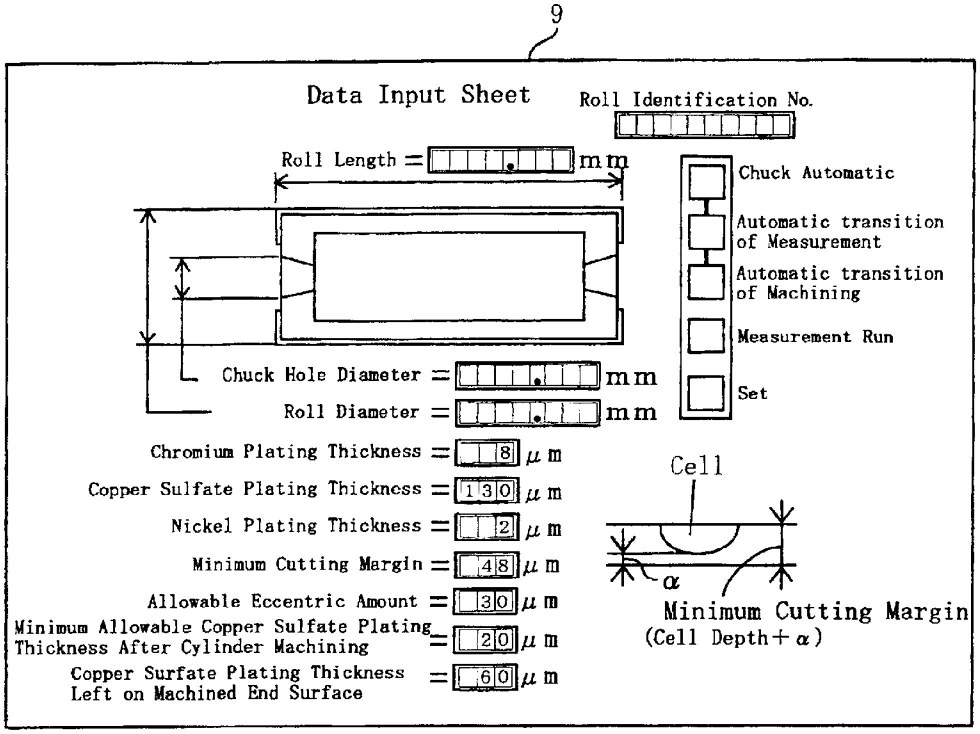
FIG. 4 is a display screen expressing input values or measured values or calculated values such as a cutting margin and the like for use in performing a precision cylinder machining through an NC lathe.
Figure 5:
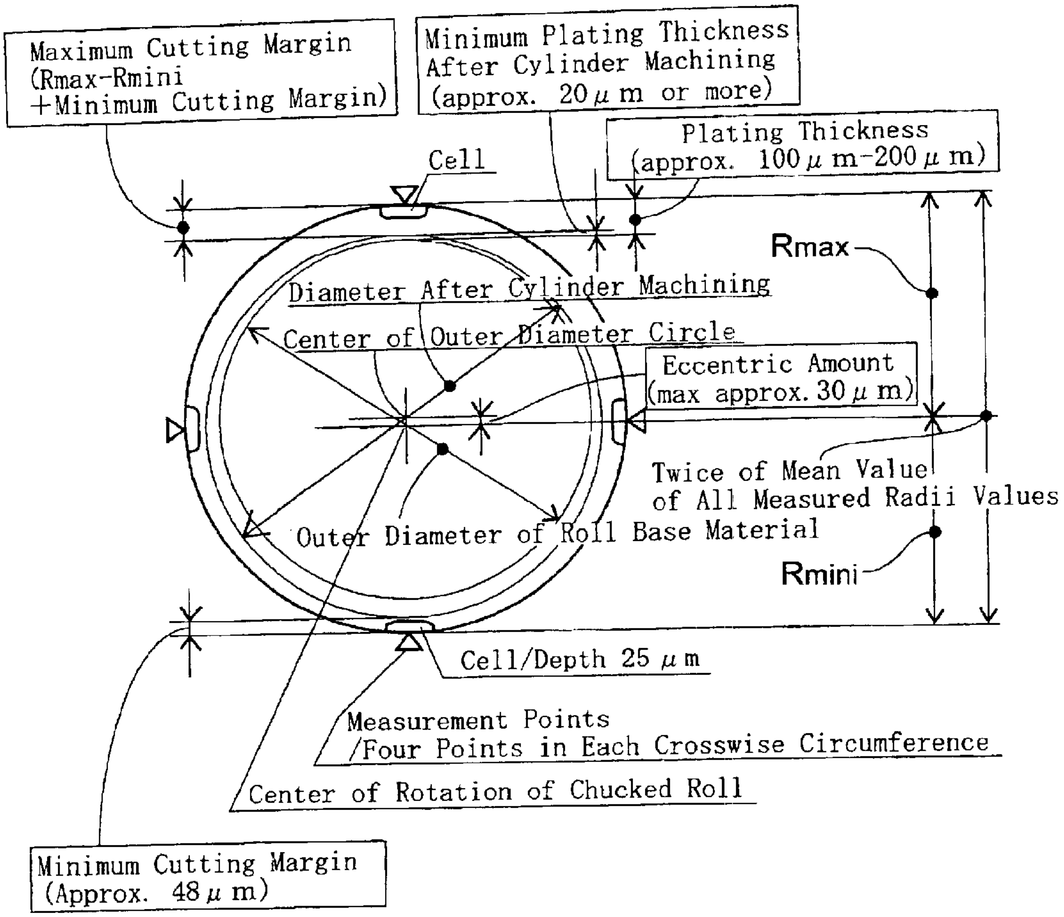
FIG. 5 is a view for expressing, through a roll sectional surface, a relation of input values or measured values or calculated values such as a cutting margin and the like for use in performing a precision cylinder machining through an NC lathe.

Subsequently, the cutting tools 8*g*, 8*h*, . . . installed at the cutting tool rest 8*e* automatically perform an end surface machining and a precision cylinder machining. Detailed description of FIGS. 4 and 5 are eliminated.

The grinder 9 performs a grinding operation as follows in regard to a photogravure-plated roll cylindrically machined by the NC lathe 8 and subsequently copper sulfate plated. The grinder 9 is an opposed double-head type grinder composed of a middle finishing grinder stone 9*a* of #1000 and a precision grinding stone 9*b* of #6000, for example, and the middle finishing grinder stone 9*a* of #1000 performs a grinding operation for miniaturizing a surface roughness after copper plating, and the precision grinding stone 9*b* of #6000 performs a grinding operation for miniaturizing a surface roughness and further performs a mirror finish grinding. An electrolysis grinder particle grinding operation may be employed in place of the grinder 9.

The roll stock device 10 in this embodiment is installed on the photosensitive film-coating device 6 and the infrared laser-exposing device 7. The roll stock device 10 may be of a turn-table structure where the photogravure plated roll is inclined by about 70° and mounted at a generating line of a conical surface.

At the handling area of the industrial robot 1 in the plate making room H1, the photogravure plated roll R advanced to a stage where one of the devices treats it during an operation of the device is stocked at the roll stock device 10.

The roll fixing or removing device 19 is installed at the location nearest to the plate making room H1, has two conical rolls at one axle, two receiving rails are arranged side by side with small diameter ends of the conical rolls being oppositely faced and the industrial robot 1 enables the photogravure plated roll to be mounted on the two receiving rails. The roll fixing/removing rotating device 3 stocked at the stock device 18 is lifted up by the stacker crane 2 and transported by it and mounted at the frame of the roll fixing or removing device 19. The roll fixing/removing rotating device 3 can chuck the photogravure plated roll R at both ends by a pair of opposed chuck means. The stacker crane 2 transports the roll fixing/removing rotating device 3 having the photogravure plated roll R chucked at both ends and enables the frame part of the roll fixing/removing rotating device 3 from the device 10 fitted to and mounted to the frame part 19.

The surface activation device 11 supports the roll fixing/removing rotating device 3 transported by the stacker crane 2 before carrying out a nickel plating, rotates the photogravure plated roll R supported at both ends by said roll fixing/removing rotating device 3, an operation for immersing it in alkaline liquid to remove fat and pickling it with shower of acid liquid is repeated twice, it is washed with water shower and subsequently a drying air is blown against it as required.

The nickel-plating device 12 supports, by a frame, the roll fixing/removing rotating device 3 transported by the stacker crane 2 after surface activation, rotates the photogravure plated roll R supported at both ends by the roll fixing/removing rotating device 3, immerses the photogravure plated roll R in nickel plating liquid and rotates it there, and adheres nickel plating to it in such a way that its thickness may become 2 to 3 $\mu$m, for example. This nickel plating is an interface for use in applying a copper plating to the photogravure plated roll in which the roll base material is iron.

The copper sulfate plating device 13 supports, by a frame, the roll fixing/removing rotating device 3 transported by the stacker crane 2 after nickel plating, rotates the photogravure plated roll R supported at both ends by the roll fixing/removing rotating device 3, immerses the photogravure plated roll R in copper sulfate plating liquid and rotates it there, and adheres copper sulfate plating to it in such a way that its thickness may become 100 to 120 μm, for example.

The chromium plating device 14 supports, by a frame, the roll fixing/removing rotating device 3 transported by the stacker crane 2 after removal of the resist image, rotates the photogravure plated roll R supported at both ends by the roll fixing/removing rotating device 3, immerses the photogravure plated roll R in chromium plating liquid and rotates it there, and adheres chromium plating to it in such a way that its thickness may become 7 to 8 meter, for example, and upon completion of this process, water washing is carried out for it. In addition, it may also be applicable that in place of the chromium-plating device 14, a nickel alloy-plating device enabling a quenching is installed. When the nickel alloy-plating device is to be installed, it becomes necessary to perform a quenching with laser radiation or a high frequency quenching and so a device for performing it is installed.

The developing device 15 supports, by a frame, the roll fixing/removing rotating device 3 transported by the stacker crane 2 after completion of an image printing, rotates at a slow speed the photogravure plated roll R supported at both ends by the roll fixing/removing rotating device 3, after a tank storing alkaline developing liquid opens a lid and ascends, immerses the photogravure plated roll R in alkaline developing liquid and rotates it there, the exposed portion of the photosensitive film is dissolved with alkaline liquid to form the resist image with the non-image line being left, and upon completion of the developing operation, the tank descends, the lid is closed, the alkaline developing liquid is washed away and water washing is performed.

As the developing liquid, developing agent for a positive-type photosensitive composition composed of (a) ortho-silicic soda, (b) trisodaphosphate, (c) surface active agent and the like is used.

Further, it may also be applicable that the developing device 15 is installed at a location near an outdoor operation part in the robot room and the developing operation can be manually controlled separate from an automatic developing line. In this case, a chuck device and a device for carrying out a waterproof operation at the chuck part are additionally installed because the roll fixing/removing rotating device 3 cannot be used. In addition, it is desirable to add a dehumidifying device in the casing.

The corrosion device 16 immerses the photogravure plated roll R in aqueous solution of copper (II) chloride and rotates the roll to collide a copper exposed surface not covered by the resist image of the photogravure plated roll R and to form a cell.

The resist image removing device 17 immerses the photogravure plated roll R in stronger alkaline liquid than developing liquid and rotates it to dissolve the resist image having the photosensitive film exposed with stronger alkaline liquid and hardened and to dissociate it from the photogravure plated roll R.

In the roll transporting area of the stacker crane 2 in the plate making room H2, the photogravure plated roll R advanced to such a step at one of the devices being operated is stocked at the stock device 18 while the roll is being chucked at the roll fixing/removing rotating device 3.

A program for use in controlling the photogravure plate making steps is stored in the controller 20 for entirely controlling the system.

The following steps carry out a plate making for a direct plate type photogravure plated roll.

[Loading]

A photogravure plated roll is fixed to the roll measuring device 4 to measure its length, outer diameter and chuck hole diameter and then the industrial robot 1 comes to receive the photogravure plated roll.

In the case that the length, outer diameter and chuck hole diameter of the photogravure plated roll have already been known, the photogravure plated roll leans against the roll loading and unloading device 5, and the roll loading and unloading device 5 keeps the photogravure plated roll in a horizontal state. Then, the industrial robot 1 comes to receive the photogravure plated roll.

Then, the industrial robot 1 stocks the photogravure plated roll in the roll stock device 10 or delivers it to the NC lathe 8.

[C ll—Image Cutting]

The NC lathe 8 measures a diameter of the photogravure plated roll through multi-points, performs a requisite and minimum precision cylindrical machining operation in response to a result of measurement and cell-image cutting.

[Surface Activation Processing—Plating]

The photogravure plated roll having the precision cylindrical machining finished with the NC lathe 8 is processed with the surface activation device 11 for the surface activation treatment, a nickel plating is carried out by the nickel plating device 12 to have a thickness of 2 to 3 μm and then a copper sulfate plating is carried out by the copper sulfate plating device 13 to have a thickness of about 40 μm.

[Grinding]

A surface skin of the photogravure plated roll having copper plating adhered to it is ground with the grinder 9, a grinding for making a surface roughness minute is performed and then a mirror grinding is carried out.

[Wiping—Coating of Photosensitive Film—Film Making—Reduction of Residual Solvent]

The photogravure plated roll is chucked at both ends to the photosensitive film coating device 6, rotated at a slow speed, the photogravure plated roll is wiped and cleaned with a wiping cloth, subsequently the photosensitive film coating is carried out under a non-contact spiral scanning system for the positive-type photosensitive agent, and upon completion of the coating process, the slow speed rotation is continued for 10 minutes, for example, as it is, the film is made under a natural drying and subsequently the rotation is changed over to a high speed rotation to continue for 10 minute so as to substantially reduce the residual solvent in the positive-type photosensitive film, for example.

[Exposure/Ablasion of a Positive Image]

The photogravure plated roll is chucked at its both ends at the infrared laser exposing device 7, rotated at a desired high speed, an infrared laser exposing head is approached to it to expose a positive image, main chain or side chain of molecules in the photosensitive film forming resin at the exposed part is cut to attain a low molecule having alkaline solubility more increased and at the same time a latent image having a photosensitive layer ablasion properly generated.

[Development]

A development is carried out at the developing device 15 with alkaline developing liquid of about pH 10.0 to 11.0 to form a negative mask for a resist image.

[Etching—Forming of Cell]

Etching is carried out at a corrosion device 16 with copper (II) chloride liquid to form a cell (a notch for storing ink).

[Removal of a Resist Image]

A resist image is removed with alkaline liquid (pH of about 13.0 to 13.5) having a stronger alkalinity than that of alkaline developing liquid at the resist image-removing device 17.

[Chromium Plating]

Hard chromium plating with a thickness of 7 to 8 μm is applied by the chromium plating device 14.

[Sandblasting]

Sandblasting is carried out with a sand paper. The sandblasting can be classified as one performed automatically in an in-line mode and the other performed manually in an out-of-line mode.

[Unloading]

The photogravure plated roll having plate making completed is mounted on a pallet of the roll loading/unloading device 5, its door is opened and the pallet of the roll loading/unloading device 5 is raised upright and unloaded manually.

In the case that NC lathe 8 is not installed, the grinder 9 performs a machining operation in place of it.

At this time, the photogravure plated roll is fixed to the roll-measuring device 4 to measure its length, outer diameter and chuck hole diameter, and then a diameter measurement is carried out for measuring a diameter from one end to the other end of the roll for every specified pitch and the roll is ground by the grinder 9. This grinding step with the grinder 9 is performed such that a correcting grinding for uniformly making a diameter with a rough grinder stone—cell-image cutting with the rough finish grinding—a surface roughness minute grinding with the rough finish grinding stone are carried out before performing the surface activation processing. Due to this fact, it is preferable that the grinder 9 is provided with a four-head type grinder. When the NC lathe 8 is not installed, a device for removing chromium is arranged and then a chromium removal is carried out such that the roll is immersed in hydrochloric acid after measurement of the roll and before correction grinding and is rotated.

The plate making for the ballade-plating type photogravure-plating roll is carried out as follows.

Loading after peeling of ballade-plating—surface activation processing—coating of silver oxalate liquid (liquid for weakening close fitness of ballade copper sulfate plating)—ballade copper sulfate plating—measurement by a roll measuring device—correction grinding finishing grinding mirror grinding—wiping with a wiping cloth—non-contact coating of positive-type photosensitive agent—film forming through natural drying—reduction in residual solvent in positive-type photosensitive film—exposure of the positive image with infrared laser—developing—forming of etching cell—removal of resist image—chromium plating—unloading.

Further, it is also applicable that the measurement by the roll measuring device—correction grinding can be avoided.

The plate making against the cell-image cutting type photogravure plated roll using alminum as its roll base material is carried out as follows under a condition where aluminum is not exposed in a precision cylinder machining by the lathe.

Loading—precision cylinder machining with the lathe cell-image cutting—finish grinding—surface activation processing-copper sulfate plating—finish grinding mirror grinding—wiping with a wiping cloth—non-contact coating of positive-type photosensitive agent—film forming under natural drying—reduction of residual solvent in the positive-type photosensitive film—exposure of positive image with infrared laser—developing—forming a cell, etching—removal of resist image—chromium plating-unloading.

Further, the finish grinding after cell-image cutting can be avoided.

In order to apply a nickel plating to the aluminum roll base material, as a pre-treatment, a surface treatment by anodale method or zincate method is carried out to form an interface thin film for improving a close fitness and a device required for this operation may also be installed in in-line manner at the plate making room H2.

Upon completion of description in regard to the plate making line and also description in regard to the plate making step, a substantial gist of the photogravure plate making method of the present invention is further described in detail newly as follows.

It is preferable that a rate of inclusion of solid substance of the alkaline soluble organic polymer substance having phenolic hydroxyl group in the positive-type photosensitive composition is 80 to 96 wt % and it is further preferable that this value is 90 to 94 wt %.

It is preferable that a rate of inclusion of solid substance of the photo-thermal conversion substance in the positive-type photosensitive composition is 1 to 10 wt % and it is further preferable that this value is 2 to 4 wt %.

It is preferable that a rate of inclusion of solid substances in polyvinylpolypirrolidone/polyvinyl acetate copolymers or the like as alkaline soluble resin is 1 to 10 wt % and further it is preferable that this value is 2 to 4 wt %.

The positive-type photosensitive composition of the present invention is used under its thinned state in solvent. A rate of use of solvent in this case is normally in a range of about 1 to 20 times in regard to a total amount of photosensitive composition by its weight ratio.

As the alkaline soluble organic polymer substance having phenolic hydroxyl group, novolac resin, resol resin, polyvinyl phenolic resin, copolymers of acrylic acid derivative having phenolic hydroxyl group, alkaline soluble epoxy resin having epoxy resin reacted with phenolic hydroxyl group or the like and additionally alkaline soluble organic polymer substance having phenolic hydroxyl group described in Japanese Patent Laid-Open No. 1999-231515 can be applied as they are and in particular, novolac resin or polyvinyl phenolic resin is preferably applied.

Novolac resin is resin where at least one: of phenols is polycondensated with at least one of aldehydes or ketones under a presence of acid catalyst. In particular, this is a polycondensation material of mixed phenols composed of m-cresol, p-cresol, 2,5-Xylenol, 3,5-Xylenol, and resorcinol, or mixed phenols composed of phenol, m-cresol and p-cresol and formaldehyde, and weight-average molecular weight (MW) reduced by polystyrene through a gel permeation chromatography measurement is preferably 1,500 to 10,000.

Resol resin is resin polycondensated in the same manner except application of alkaline catalyst in place of acid catalyst in a polycondensation of novolac resin.

Polyvinylphenol resin is resin where either one or more than two kinds of hydroxystyrenes, for example, are polymerized under a presence of radical polymerization initiater or cation polymerization initiater. It is preferable to apply polymer of hydroxystyrenes having alkyl group with the number of carbon being 1 to 4 applied as substituent on benzene ring or polymer of hydroxystyrenes having benzene ring without any substitution.

The photo-thermal conversion substance has an absorbing region at a part of or an entire of an infrared wavelength range with a wavelength of 700 to 1,100 nm, has a characteristic for absorbing laser beam in the infrared wavelength region to perform a thermolysis and contributes to an alkaline soluble low molecular formation and abrasion caused by thermal cutting of molecules of the alkaline soluble organic polymer substances having the aforesaid phenolic hydroxyl group. An increased or decreased amount of added volume of the photo-thermal conversion substances is related to an excessive amount and a poor amount of heat generated through exposure, a strong state or weak state of the infrared laser beam is related to an excessive or poor thermolysis of the alkaline soluble organic polymer substance present at the exposed portion, so that it is set to an appropriate amount.

As the photo-thermal conversion substance, organic or non-organic pigment or dyestuff, organic pigment, metal, metal oxide, metal carbide, metal boride or the like and photo-thermal conversion substance described in Japanese Patent Laid-Open No. 1999(11)-231515 having an absorbing region at a part of or entire infrared range with a wavelength of 700 to 1,100 nm can be totally applied as they are. Heterocycles or the like including nitrogen atom, oxygen atom or sulfur atom and the like are combined by polymethine $(—CH=)_n$, widely-defined so-called cyanine type pigment can be applied as a typical one and more practically, for example, quinoline type (so-called "cyanine type"), indole type (so-called indocyanine type), benzothiazole type (so-called "thiocyanine type"), iminocyclohexadiene type (so-called "polymethine type"), pyrylium type, thiapyrylium type, squarylium type, chloronium type, azulenium type or the like can be applied, and in particular, quinoline type, indole type, benzothiazole type, iminocyclohexadiene type, pyrylium type, or thiapyrylium type are preferable. More particularly, phthalocyanine or cyanine is preferable.

As solvent, no specific limitation is required if solvent substance has a sufficient solubility against applied component and providing a superior film coating characteristic, Cellosolve type solvent, propylene glycol type solvent, ester type solvent, alcoholic type solvent, ketone type solvent and high polar solvent can be applied.

As Cellosolve type solvent, methyl cellosolve, ethyl cellosolve, methyl cellosolve acetate, ethyl cellosolve acetate and the like can be applied.

As propylene glycol type solvent, propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate and dipropylene glycol dimethyl ether and the like can be applied.

As ester type solvent, butyl acetate, amyl acetate, ethyl butyrate, butyl butyrate, diethyloxolate, pyruvic acid ethyl, ethyl-2-hydroxybutylate, ethyl acetoacetate, lactate methyl, lactate ethyl, 3-methoxypropioni acid methyl or the like can be applied.

As alcoholic solvent, heptanol, hexanol, diacetone alcohol, furfuryl alcohol or the like can be applied.

As high polar solvent, ketone type solvents such as cyclohexanone, methyl amylketone, dimethyl formamide, dimethylacetamide, N-methylpyrrolidone or the like can be applied.

Additionally, acetic acid, or mixed solvent of these components and solvent added with aromatic hydrocarbon can be applied.

It may also be applicable that the positive-type photosensitive compound contains either developing promoter or dissolution suppressor.

It is preferable that a small amount of dicarboxylic acid or amines or glycols, for example, is added to the developing promoter.

As the dissolution suppressor, acid coloring pigment having lactone structure is preferable. This dissolution suppressor has a function for forming a hydrogen coupling with alkaline soluble organic polymer substance to reduce a solubility of the polymer substance in order to increase a time lag for solubility in respect to alkaline developing liquid at the exposed part and the non-exposed part and further has a function scarcely absorbing light at infrared region and not dissolved with light in the infrared region.

As other dissolution suppressors, there may be applied acid coloring pigments having thiolactone structure, N,N-diarylamide structure and diarylmethylimino structure, basic coloring pigment having sulfolactone structure, non-ionic surface active agent or the like such as sulfonate, phosphate, aromatic carboxylate, aromatic disulfonic acid, carboxylic acid anhydride, aromatic ketone, aromatic aldehyde, aromatic amine, aromatic ether and the like.

The positive-type photosensitive composition of the present invention is normally applied as a positive-type photosensitive film formed with a photosensitive composition layer at a surface of a supporting member by a method wherein solution having each of the aforesaid components dissoluted in solvents such as Cellosolve type solvent, propylene glycol type solvent is coated on either a copper plating surface or a copper sulfate plating surface of the photogravure plated roll for a photogravure printing operation acting as a surface of the supporting member, naturally dried and then the roll is rotated at a high speed, air is whistled at the surface of the photogravure plated roll, a mass action caused by a centrifugal force in the photosensitive film and a slight negative pressure state near the surface cause the residual concentration of the solvent to be reduced to 6% or less.

Although it is preferable to use the device 6 for coating a photosensitive film that is a fountain coat shown in FIG. 1 as a coating method, this method is not limited to it. It is also possible to use a meniscus coat or a dip coat attained by a vertical dip coating device. A thickness of the coated film can be set in a range of about 1 to 6 $\mu$m and it is preferable to set it in a range of about 3 to 5 $\mu$m.

As a light source for use in exposing an image at a positive-type photosensitive composition layer, it is preferable to apply either a semiconductor laser or an YAG laser producing an infrared laser beam with a wavelength of about 700 to 1,100 nm. In addition, it is also possible to use a solid laser such as a ruby laser and an LED or the like.

It is preferable that a beam intensity of the laser light source is 2.0×106 mJ/s.cm2 or more and it is especially preferable that its value is 1.0×107 mJ/s.cm2 or more.

As the developing liquid used for a photosensitive film formed under application of the positive-type photosensitive composition of the present invention, it is preferable to apply developing agent composed of either a non-organic or organic alkali such as non-organic alkali, salts of Na, K, or organic alkali, TMAH, or choline and the like. In the case of an experiment, as the developing liquid, original developing liquid containing (a) orthosilicate soda (b) phosphoric tersoda etc. (c) surface active agent and the like was applied.

The developing operation is normally carried out through an immersion development, spray development, brush development and ultrasonic development or the like at a temperature of about 15 to 45° C. and preferably at a temperature of about 27 to 32° C.

[Development Latitude of the Positive-Type Photosensitive Composition]

The development latitude of the positive-type photosensitive composition is attained by the phenomena that (1) a coupling degree of films is appropriate, either the main chain or the side chain of molecules is cut at the exposed portion through exposure of the infrared laser beam, a physical change such as a conformation change to cause the molecule to become low molecules showing a more increased alkaline solubility as well as an appropriate dispersion ablasion of the photosensitive layer is generated to produce a thin film and the molecule is changed to be dissoluted in the alkaline developing liquid within a short period of time; and (2) the non-exposed portion is not dissoluted for a relative longer period than that of the exposed portion until it is dissoluted with alkaline developing liquid even if a slight variation occurs in temperature and humidity, and is strongly and closely adhered to the coated surface.

The developing latitude cannot be attained under the fact that if adhesion of the material (close fitness reforming agent) enforcing the close fitness is strong, weak adhesion of the alkaline soluble organic polymer substances having a phenolic hydroxyl group can be reinforced. Realization of adhesion caused by the material enforcing close fitness at the positive-type photosensitive composition is relatively determined in reference to both a type and an adding amount of material enforcing the close fitness.

For example, in the case of the positive-type photosensitive composition having titanium alkoxide selected as material enforcing a close fitness and a large amount of titanium alkoxide added, a strength, stability and close fitness of the entire film become too strong after burning operation, resulting in that a physical change such as a conformation change caused by exposure of the infrared laser beam or dispersion at the photosensitive layer (ablasion) is not generated, and even if the developing operation is carried out, the exposed portion is scarcely dissoluted in the developing liquid and an entire film is not decreased. That is, the developing latitude cannot be attained at all.

As an added amount is reduced gradually, the film is decreased and an area where the developing latitude can be attained is slightly produced, but a slight difference in room temperature or humidity causes the developing latitude not to be attained at once.

In turn, even if a silane-coupling agent is added to the alkaline soluble organic polymer substance having phenolic hydroxyl group, strong adhesion cannot be attained, there occurs no difference between one time in which the positive-type photosensitive composition layer at the exposed portion is dissoluted in the alkaline developing liquid and the other time in which the positive-type photosensitive composition layer at the non-exposed portion is dissoluted in the alkaline developing liquid, and they occur concurrently and the developing operation cannot be attained.

Further, the following positive-type photosensitive composition is made under a condition of a room temperature of 25° C. and humidity of 25 to 60%, the composition is coated on a copper surface or a copper sulfate plated surface, a concentration of the residual solvent is 6% or less, a superior developing operation capable of attaining a sharp pattern not producing any residuals in about 60 to 70 second can be carried out.

The most superior developing latitude is realized when vinylpirrolidone/dimethylaminoethylmethacrylate copolymers and the like is contained by about 3% for its solid substance rate.

[Positive-Type Photosensitive Composition of the Present Invention]

The positive-type photosensitive composition of the present invention contains an alkaline soluble organic polymer substance having epoxy resin with a phenolic hydroxy group or reacted with phenolic hydroxy group, and a photo-on thermal conversion substance for absorbing infrared rays of an image exposing light source and converting it into heat, and further as a close fitness reforming agent, there will be mixed with and added by any one of the following substances, i.e. polyvinylpolypirrolidone/polyvinylacetate copolymers, polyvinylbutyral, stylene/maleic acid copolymers, vinylpyrrolidone/dimethylaminoethylmethacrylate copolymers, vinylpyrrolidone/caprolactam/dimethylaminoethylmethacrylate terpolymer, polyvinylformal resin or terpene phenolic resin or alkylphenolic resin, melamine/formaldehyde resin, polyvinyl acetate or ketone resin.

[Chemical formula 2]

(2)

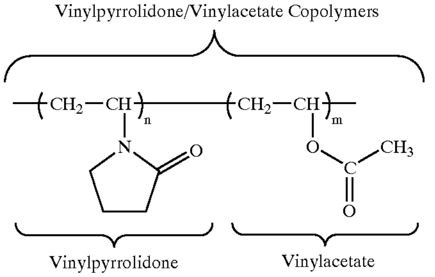

[Chemical Formula 3]

(3)

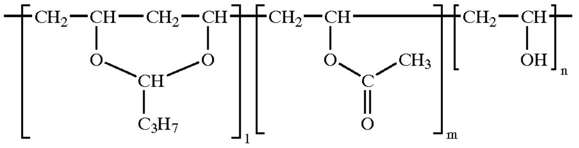

[Chemical Formula 4]

(4)

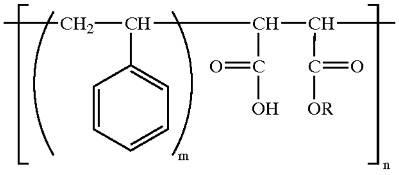

[Chemical formula 5]

(5)

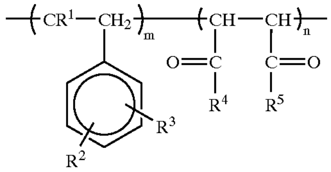

In the formula (5), R1 denotes either a hydrogen atom or a methyl group, R2 denotes a hydrogen atom, hydroxy group, alkyl group or alkoxy group, R3 denotes either a hydrogen atom or a hydroxyalkyl group, R4 and R5 denote independently a hydrogen atom, lower alkyl group or group having reactive double-bond, m and n denote integer more than 1 and m≧n.

[Chemical Formula 6]

(6)

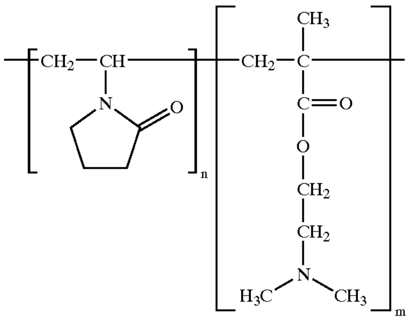

[Chemical formula 7]

(7)

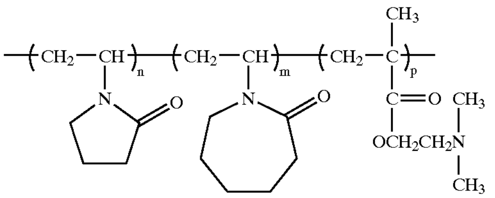

[Chemical formula 8]

(8)

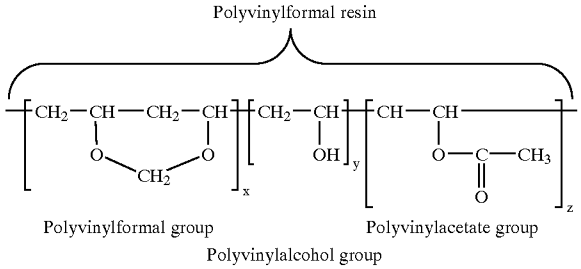

[Chemical formula 9]

(9)

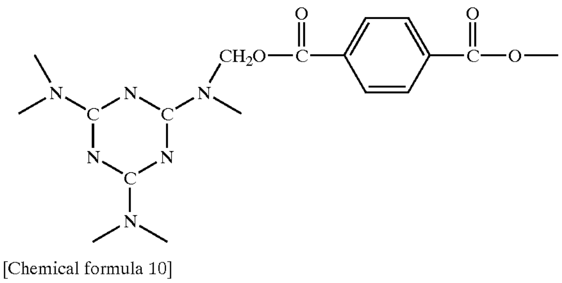

[Chemical formula 10]

(10)

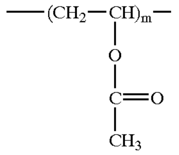

-continued

[Chemical formula 11]

(11)

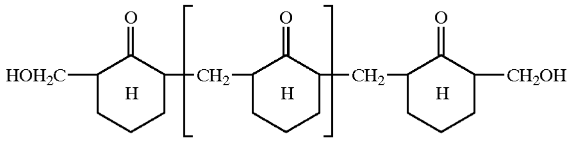

[Chemical formula 12]

(12)

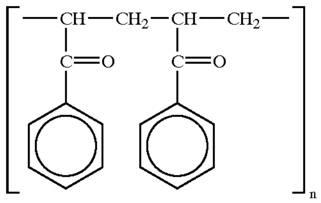

[Chemical Formula 2] indicates polyvinylpolypyrrolidone/polyvinylacetate copolymer.

PVP/VA copolymers (Vinylpyrrolidone/Vinylacetate Copolymers) are transparent thermoplastic linear random copolymers in which vinylpyrrolidone and vinylacetate are free radical polymerized with a rate of 70/30 to 30/70, molecular weight is 20,000 to 50,000, and hydrophilicity is increased as a rate of vinylpyrrolidone is increased.

PVP/VA copolymers are preferably made such that vinylpyrrolidone and vinylacetate have a rate of 60/40, a molecular weight in this case is 45x103 and Tg is 110° C.

[Chemical Formula 3] indicates polyvinylbutyral.

Polyvinylbutyral:

Existing chemical substance No. 6-708 is substance attained by butyral formation where butylaldehyde is reacted with polyvinylalcohol, a substantial amount of hydroxy group and acetyl group is left and this is indicated by a structure denoted by a following general formula.

As PVB, there are many products, such as Denka butyral 5000A, 6000EP manufactured by Denki Kagaku Kogyo Kabushiki Kaisha; products of Sekisui Kagaku Kogyo Co., Ltd. BL-1, BL-2, BL-2, BL-S, BX-L of low polymerization degree type; BM-1, BM-2, BM-5, BM-S of middle polymerization degree type; BH-3, BH-S, BX-1, BX-2, BX-5, BX-55 of high polymerization degree and it is preferable in reference to a result of experiment that BL-S, BM-S and BH-S having solubility in various kinds of solvent are used.

[Chemical Formula 4] and [Chemical Formula 5] indicate stylene/maleic acid copolymers.

Styrene/maleic acid copolymers are copolymers of styrene and maleic acid.

Styrene/maleic acid copolymers indicated in the formula (4) have a product name Oxilack SH-101, copolymers of styrene and maleic acid semi-ester. It is preferable to use product in which maleic acid semi-ester is adjusted in styrene solution with an acid value of 60 to 90 under an alcoholic reaction.

As styrene/maleic acid copolymers indicated in the formula (5), there may be present copolymers in which styrenes such as styrene, α-methystyrene, m or p-methoxystyrene, p-methylstyrene, p-hydroxysturene, 3-hydroxymethyl-4 hydroxy-styrene or its derivative (styrene type monomer), and maleic acid derivatives such as maleic anhydride, maleic acid, maleic acid monomethyl, maleic acid monoethyl, maleic acid mono-n-propyl, maleic acid mono-iso-propyl, maleic acid mono-n-butyl, maleic acid mono-iso-butyl, maleic acid mono-tert-butyl and the like are copolymerized (hereinafter called as a "copolymer (a)"). As the copolymer (a), although not indicated in the aforesaid structural formula, there may be present methylmethacrylate, alkylmethacrylate such as t-butylmethacrylate, alkylacrylate, or the aforesaid copolymer (a) are denatured by compound having a reactive double-bond (hereinafter called as copolymer (b)). m and n in this case are integers more than 1 and have a relation of m≧n, and preferably m/n 1 to 1.1. As a weight-average molecular weight, a value of 1,500 to 100, 000 is preferable.

The aforesaid copolymer (b) can be manufactured by a method wherein either acid anhydride group or carboxy group in the copolymer (a) is reacted with unsaturated alcohols, for example, allyl alcohol, 2-butene-1-2-ol, furfuryl alcohol, oleyl alcohol, cinnamic alcohol, 2-hydroxyethylacrylate, hydroxyethylmethacrylate, N-methylolacrylamide; and epoxy compound having each of one oxilane ring and reactive double-bond such as glycidilacrylate, glycidilmethacrylate, allylglycidilale, α-ethylglycidilacrylate, crotonilglycidilether, itaconic acid monoalkylmonoglycidilester or the like. In this case, it is required that carboxyl group necessary for performing an alkaline developing operation is left in the copolymer.

Epoxy compound having respective one of the aforesaid oxicilane ring and reactive double-bond is reacted with material having a reactive double-bond fed through unsaturated alcohol of the copolymer (b) attained as described above so as to increase a concentration of the reactive double-bond and then a copolymer having an increased concentration of the reactive double-bond (hereinafter called as a "copolymer (c)") can be manufactured.

Polymer having carboxy group other than styrene/maleic acid copolymer can also attain a reactive double-bond in the same manner as described above. Applying of the reactive double-bond to the copolymer is preferable in view of a photosensitivity. Synthesis of these copolymers (copolymer (a), copolymer (b), copolymer (c) and the like) can be performed in accordance with the methods described in the gazettes of Japanese Patent Publication Numbers 1972(47)-25470, 1973(48)-85679 and 1976(51)-21572.

[Chemical Formula 6] indicates vinylpyrrolidone/dimethylaminoethylmethacrylate copolymers.

[Chemical Formula 7] indicates vinylpyrrolidone/caprolactam/dimethylaminoethylmethacrylate terpolymers. [Chemical Formula 8] indicates polyvinylformal. Polyvinyl formal resin can be attained as product by a method wherein vinyl acetate monomer is polymerized through catalyst to make polyvinyl acetate, then polyvinyl acetate is dissoluted in acetic acid, then formaldehyde and sulfuric acid are added to it to perform both saponification (alkaline hydrolysis) and formal reaction concurrently, dilute sulfuric acid are added to it to cause polyvinyl formal resin to be settled, and it is further processed through solvent recovering, washing and drying steps.

Polyvinyl formal resin is composed of polyvinyl formal group, polyvinyl alcohol group and polyvinyl acetate group and has a superior electrical insulating characteristic.

[Terepenephenol resin and alkyl phenolic resin are not indicated in chemical formula.]

Terepenephenol resin and alkylphenol resin are products manufactured by Arakawa Chemical Industry Ltd. As terepenephenol resin, product names of Tamanor 803L, 901 can be used and as alkylphenol resin, product names of Tamanor 520S, 521, 526, 586 and 572S can be used.

[Chemical Formula 9] indicates melamine/formaldehyde resin.

Melamine/formaldehyde resin is made by reacting melamine (C3H6N6) and formaldehyde. This synthetic reaction is not complete and non-reacted formaldehyde is left.

[Chemical Formula 10] indicates polyvinyl acetate.

Polyvinyl acetate is polymer compound made by polymerizing vinyl acetate, and for example, Sacnor SN-09T (product name) manufactured by Denki Kagaku Kogyo Kabushiki Kaisha can be used. Polyvinyl acetate has a structure indicated in the following chemical formula which is solid having white to light yellow in color not dissoluted in water, but soluble in alcohol type, acetic ester type and aromatic type solvent.

[Chemical Formula 11] and [Chemical Formula 12] indicate ketone resin.

As ketone resin, any one of methyl ethyl ketone, methyl isobutyl ketone, acetophenon, cyclohexanone, methylcyclohexanon may be applied. In this case, it is preferable to apply cyclohexanon indicated in Chemical Formula 11 and acetophenon indicated in Chemical Formula 12.

EMBODIMENTS AND COMPARATIVE EXAMPLES

[Developing Latitude of Positive-Type Photosensitive Composition of the Present Invention]

In Table 1 to Table 10 are indicated some results of embodiments where the photogravure plate making was carried out under the plate making process described under application of these positive-type photosensitive compositions.

Following four types of positive-type photosensitive composition used in the embodiments in Table 1 to Table 10 and the comparative example in Table 11 were made as undiluted water. % values in Table 1 to Table 11 are weight % in respect to solid substance.

(a) Undiluted Solution A:

This is composed of novolac resin and phthalocyanine pigment having absorbing band at a part or entire infrared range with a wavelength of 700 to 1,100 nm, absorbing laser beam and attaining thermolysis.

As this novolac resin, polycondensation substance composed of mixed phenols of m-cresol, p-cresol, 2, 5-xylenol, 3,5-xylenol and resorcinol, and formaldehyde was used.

(b) Undiluted Solution B:

This is diluted solution composed of resol resin and the aforesaid phthalocyanine pigment.

(c) Undiluted Solution C:

This is undiluted solution composed of polyvinylphenol resin and the aforesaid phthalocyanine pigment.

(d) Undiluted Solution D:

This is undiluted solution composed of copolymer of acrylic acid derivatives having phenolic hydroxy group, and phthalocyanine pigment.

Embodiments and comparative examples were carried out such that roll base material in all these examples is iron, a photogravure plated roll with a diameter of φ200 mm plated with copper sulfate and mirror ground is chucked at both ends in a fountain coating device (a dehumidifying device and a humidifying device are installed there to enable a humidity to be controlled as desired) where solvent in the positive-type photosensitive composition is evaporated during coating operation and a rate of the solvent in it is prevented from being changed, the roll is rotated at a speed of 25 r.p.m., the roll is sufficiently wiped with a wiping cloth, then a pipe for springing out test photosensitive liquid having positive-type photosensitive composition thinned to a predetermined concentration by solvent (MEK) at its upper end is positioned at one end of the photogravure plated roll to have a gap of about 500 μm, the test photosensitive liquid is sprung out only by an amount required for the coating operation, the pipe is moved from one end of the photogravure plated roll to the other end to make a uniform a coating of the test photosensitive liquid by a spiral scan system and its rotation is continued at 25 r.p.m. for 5 minute upon completion of coating operation, and then its rotation is stopped. After this period, it took 5 minute and liquid dripped state was observed and occurrence of liquid dripping could not be observed with naked eyes. Then, upon measurement of a film thickness, it showed that there was no difference at a lower surface of the roll and an upper surface of the roll. Thus, it was confirmed that the photosensitive film dried not to produce any liquid dripping could be set.

Subsequently, the test roll was rotated at 100 r.p.m. for 10 minute, stopped and a concentration of residual solvent in the photosensitive film was measured to show 2.9%.

Subsequently, the test roll was fixed to the infrared laser-exposing device 7 (manufactured by Think Laboratory Co., Ltd.) having a high output semiconductor laser head manufactured by Creo-Scitex Corporation, laser of infrared wavelength range was radiated against the test roll, the developing tank was raised, the developing operation was carried out for about 60 to 70 second until the residual is eliminated and then the roll was washed with water.

Cutting at an edge of the resist image, residue, surface state of the resist and its hardness were observed by a microscope to judge a printing sensitivity, better or poor state of developing and developing latitude.

As to these positive-type photosensitive compositions, the coated film was formed at the photogravure-plated roll, the roll was fixed to the developing device under non-heated condition, the roll was rotated, the developing tank was raised, developing operation was carried out for about 60 to 70 second until the residue is eliminated, then the roll was washed with water, cutting at an edge of the resist image, residue, surface state of the resist and its hardness were observed by a microscope to judge a printing sensitivity, better or poor state of developing, film reduction and developing latitude.

Although the image line part exposed by alkaline developing liquid was washed away and the non-image line part not exposed by alkaline developing liquid produced a film reduction, the experiment confirmed that the roll has a developing latitude where a sharp pattern is left and is not washed away.

TABLE 1

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Embodi-ment 1 | undiluted solution A | PVP/VA Copoly-mer 2% | None | 25° C. No burning | 25% | Ex-cellent |
| Embodi-ment 2 | undiluted solution A | PVP/VA Copoly-mer 2.5% | None | 25° C. No burning | 30% | Ex-cellent |
| Embodi-ment 3 | undiluted solution A | PVP/VA Copoly-mer 3% | None | 25° C. No burning | 55% | Ex-cellent |

TABLE 1-continued

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Embodi-ment 4 | undiluted solution A | PVP/VA Copoly-mer 4% | None | 25° C. No burning | 60% | Ex-cellent |
| Embodi-ment 5 | undiluted solution B | PVP/VA Copoly-mer 2% | None | 25° C. No burning | 25% | Ex-cellent |
| Embodi-ment 6 | undiluted solution B | PVP/VA Copoly-mer 2.5% | None | 25° C. No burning | 30% | Ex-cellent |
| Embodi-ment 7 | undiluted solution B | PVP/VA Copoly mer 3% | None | 25° C. No burning | 55% | Ex-cellent |
| Embodi-ment 8 | undiluted solution B | PVP/VA Copoly-mer 4% | None | 25° C. No burning | 60% | Ex-cellent |
| Embodi-ment 9 | undiluted solution C | PVP/VA Copoly-mer 2% | None | 25° C. No burning | 25% | Ex-cellent |
| Embodi-ment 10 | undiluted solution C | PVP/VA Copoly-mer 2.5% | None | 25° C. No burning | 30% | Ex-cellent |
| Embodi-ment 11 | undiluted solution C | PVP/VA Copoly-mer 3% | None | 25° C. No burning | 55% | Ex-cellent |
| Embodi-ment 12 | undiluted solution C | PVP/VA Copoly-mer 4% | None | 25° C. No burning | 60% | Ex-cellent |

TABLE 2

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Embodi-ment 13 | undiluted solution A | Polyvinyl butyral 2% | None | 25° C. No burning | 25% | Ex-cellent |
| Embodi-ment 14 | undiluted solution A | Polyvinyl butyral 2.5% | None | 25° C. No burning | 30% | Ex-cellent |
| Embodi-ment 15 | undiluted solution A | Polyvinyl butyral 3% | None | 25° C. No burning | 55% | Ex-cellent |
| Embodi-ment 16 | undiluted solution A | Polyvinyl butyral 4% | None | 25° C. No burning | 60% | Ex-cellent |
| Embodi-ment 17 | undiluted solution B | Polyvinyl butyral 2% | None | 25° C. No burning | 25% | Ex-cellent |
| Embodi-ment 18 | undiluted solution B | Polyvinyl butyral 2.5% | None | 25° C. No burning | 30% | Ex-cellent |
| Embodi-ment 19 | undiluted solution B | Polyvinyl butyral 3% | None | 25° C. No burning | 55% | Ex-cellent |
| Embodi-ment 20 | undiluted solution B | Polyvinyl butyral 4% | None | 25° C. No burning | 60% | Ex-cellent |

TABLE 2-continued

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Embodi-ment 21 | undiluted solution C | Polyvinyl butyral 2% | None | 25° C. No burning | 25% | Ex-cellent |
| Embodi-ment 22 | undiluted solution C | Polyvinyl butyral 2.5% | None | 25° C. No burning | 30% | Ex-cellent |
| Embodi-ment 23 | undiluted solution C | Polyvinyl butyral 3% | None | 25° C. No burning | 55% | Ex-cellent |
| Embodi-ment 24 | undiluted solution C | Polyvinyl butyral 4% | None | 25° C. No burning | 60% | Ex-cellent |

TABLE 3

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Embodi-ment 25 | undiluted solution A | SM Type copoly-mer 2% | None | 25° C. No burning | 25% | Ex-cellent |
| Embodi-ment 26 | undiluted solution A | SM Type copoly-mer 2.5% | None | 25° C. No burning | 30% | Ex-cellent |
| Embodi-ment 27 | undiluted solution A | SM Type copoly-mer 3% | None | 25° C. No burning | 55% | Ex-cellent |
| Embodi-ment 28 | undiluted solution A | SM Type copoly-mer 4% | None | 25° C. No burning | 60% | Ex-cellent |
| Embodi-ment 29 | undiluted solution B | SM Type copoly-2% | None | 25° C. No burning | 25% | Ex-cellent |
| Embodi-ment 30 | undiluted solution B | SM Type copoly-mer 2.5% | None | 25° C. No burning | 30% | Ex-cellent |
| Embodi-ment 31 | undiluted solution B | SM Type copoly-3% | None | 25° C. No burning | 55% | Ex-cellent |
| Embodi-ment 32 | undiluted solution B | SM Type copoly-mer 4% | None | 25° C. No burning | 60% | Ex-cellent |
| Embodi-ment 33 | undiluted solution C | SM Type copoly-mer 2% | None | 25° C. No burning | 25% | Ex-cellent |
| Embodi-ment 34 | undiluted solution C | SM Type copoly-mer 2.5% | None | 25° C. No burning | 30% | Ex-cellent |
| Embodi-ment 35 | undiluted solution C | SM Type copoly-mer 3% | None | 25° C. No burning | 55% | Ex-cellent |
| Embodi-ment 36 | undiluted solution C | SM Type copoly-mer 4% | None | 25° C. No burning | 60% | Ex-cellent |

Note:
SM type copolymer is styrene/maleic acid copolymer

TABLE 4

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Em-bodi-ment 37 | undiluted solution A | vinyl pyrroli-done/Di-methylamine ethylmeth-acrylate co-polymer 2% | None | 25° C. No burning | 25% | Ex-cellent |
| Em-bodi-ment 38 | undiluted solution A | vinyl pyrroli-one/Di-methylamine ethylmeth-acrylate co-polymer 2.5% | None | 25° C. No burning | 30% | Ex-cellent |
| Em-bodi-ment 39 | undiluted solution A | vinyl pyrroli-done/Di-methylamine ethylmeth-acrylate co-polymer 3% | None | 25° C. No burning | 55% | Ex-cellent |
| Em-bodi-ment 40 | undiluted solution A | vinyl pyrroli-done/Di-methylamine ethylmeth-acrylate co-polymer 4% | None | 25° C. No burning | 60% | Ex-cellent |
| Em-bodi-ment 41 | undiluted solution B | vinyl pyrroli-done/Di-methylamine ethylmeth-acrylate co-polymer 2% | None | 25° C. No burning | 25% | Ex-cellent |
| Em-bodi-ment 42 | undiluted solution B | vinyl pyrroli-done/Di-methylamine ethylmeth-acrylate co-polymer 2.5% | None | 25° C. No burning | 30% | Ex-cellent |
| Em-bodi-ment 43 | undiluted solution B | vinyl pyrroli-done/Di-methylamine ethylmeth-acrylate co-polymer 3% | None | 25° C. No burning | 55% | Ex-cellent |
| Em-bodi-ment 44 | undiluted solution B | vinyl pyrroli-done/Di-methylamine ethylmeth-acrylate co-polymer 4% | None | 25° C. No burning | 60% | Ex-cellent |
| Em-bodi-ment 45 | undiluted solution C | vinyl pyrroli-done/Di-methylamine ethylmeth-acrylate co-polymer 2% | None | 25° C. No burning | 25% | Ex-cellent |
| Em-bodi-ment 46 | undiluted solution C | vinyl pyrroli-done/Di-methylamine ethylmeth-acrylate co-polymer 2.5% | None | 25° C. No burning | 30% | Ex-cellent |

TABLE 4-continued

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Em-bodi-ment 47 | undiluted solution C | vinyl pyrroli-done/Di-methylamine ethylmeth-acrylate co-polymer 3% | None | 25° C. No burning | 55% | Ex-cellent |
| Em-bodi-ment 48 | undiluted solution C | vinyl pyrroli-done/Di-methylamine ethylmeth-acrylate co-polymer 4% | None | 25° C. No burning | 60% | Ex-cellent |

TABLE 5

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Em-bodi-ment 49 | undiluted solution A | vinyl pyrroli-done/Di-methylamine ethylmeth-acrylate Ter-polymer 2% | None | 25° C. No burning | 25% | Ex-cellent |
| Em-bodi-ment 50 | undiluted solution A | vinyl pyrroli-one/Di-methylamine ethylmeth-acrylate Ter-polymer 2.5% | None | 25° C. No burning | 30% | Ex-cellent |
| Em-bodi-ment 51 | undiluted solution A | vinyl pyrroli-done/Di-methylamine ethylmeth-acrylate Ter-polymer 3% | None | 25° C. No burning | 55% | Ex-cellent |
| Em-bodi-ment 52 | undiluted solution A | vinyl pyrroli-done/Di-methylamine ethylmeth-acrylate Ter-polymer 4% | None | 25° C. No burning | 60% | Ex-cellent |
| Em-bodi-ment 53 | undiluted solution B | vinyl pyrroli-done/Di-methylamine ethylmeth-acrylate Ter-polymer 2% | None | 25° C. No burning | 25% | Ex-cellent |
| Em-bodi-ment 54 | undiluted solution B | vinyl pyrroli-done/Di-methylamine ethylmeth-acrylate Ter-polymer 2.5% | None | 25° C. No burning | 30% | Ex-cellent |

TABLE 5-continued

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Em-bodi-ment 55 | undiluted solution B | vinyl pyrroli-done/Di-methylamine ethylmeth-acrylate Ter-polymer 3% | None | 25° C. No burning | 55% | Ex-cellent |
| Em-bodi-ment 56 | undiluted solution B | vinyl pyrroli-done/Di-methylamine ethylmeth-acrylate Ter-polymer 4% | None | 25° C. No burning | 60% | Ex-cellent |
| Em-bodi-ment 57 | undiluted solution C | vinyl pyrroli-done/Di-methylamine ethylmeth-acrylate Ter-polymer 2% | None | 25° C. No burning | 25% | Ex-cellent |
| Em-bodi-ment 58 | undiluted solution C | vinyl pyrroli-done/Di-methylamine ethylmeth-acrylate Ter-polymer 2.5% | None | 25° C. No burning | 30% | Ex-cellent |
| Em-bodi-ment 59 | undiluted solution C | vinyl pyrroli-done/Di-methylamine ethylmeth-acrylate Ter-polymer 3% | None | 25° C. No burning | 55% | Ex-cellent |
| Em-bodi-ment 60 | undiluted solution C | vinyl pyrroli-done/Di-methylamine ethylmeth-acrylate Ter-polymer 4% | None | 25° C. No burning | 60% | Ex-cellent |

TABLE 6

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Em-bodi-ment 61 | undiluted solution A | polyvinyl formal 2% | None | 25° C. No burning | 25% | Ex-cellent |
| Em-bodi-ment 62 | undiluted solution A | polyvinyl formal 2.5% | None | 25° C. No burning | 30% | Ex-cellent |
| Em-bodi-ment 63 | undiluted solution A | polyvinyl formal 3% | None | 25° C. No burning | 55% | Ex-cellent |
| Em-bodi-ment 64 | undiluted solution A | polyvinyl formal 4% | None | 25° C. No burning | 60% | Ex-cellent |
| Em-bodi-ment 65 | undiluted solution B | polyvinyl formal 2% | None | 25° C. No burning | 25% | Ex-cellent |

TABLE 6-continued

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Em-bodi-ment 66 | undiluted solution B | polyvinyl formal 2.5% | None | 25° C. No burning | 30% | Ex-cellent |
| Em-bodi-ment 67 | undiluted solution B | polyvinyl formal 3% | None | 25° C. No burning | 55% | Ex-cellent |
| Em-bodi-ment 68 | undiluted solution B | polyvinyl formal 4% | None | 25° C. No burning | 60% | Ex-cellent |
| Em-bodi-ment 69 | undiluted solution C | polyvinyl formal 2% | None | 25° C. No burning | 25% | Ex-cellent |
| Em-bodi-ment 70 | undiluted solution C | polyvinyl formal 2.5% | None | 25° C. No burning | 30% | Ex-cellent |
| Em-bodi-ment 71 | undiluted solution C | polyvinyl formal 3% | None | 25° C. No burning | 55% | Ex-cellent |
| Em-bodi-ment 72 | undiluted solution C | polyvinyl formal 4% | None | 25° C. No burning | 60% | Ex-cellent |

TABLE 7

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Em-bodi-ment 73 | undiluted solution A | TAMANOR 803L 2% | None | 25° C. No burning | 25% | Ex-cellent |
| Em-bodi-ment 74 | undiluted solution A | TAMANOR 803L 2.5% | None | 25° C. No burning | 30% | Ex-cellent |
| Em-bodi-ment 75 | undiluted solution A | TAMANOR 803L 3% | None | 25° C. No burning | 55% | Ex-cellent |
| Em-bodi-ment 76 | undiluted solution A | TAMANOR 803L 4% | None | 25° C. No burning | 60% | Ex-cellent |
| Em-bodi-ment 77 | undiluted solution B | TAMANOR 803L 2% | None | 25° C. No burning | 25% | Ex-cellent |
| Em-bodi-ment 78 | undiluted solution B | TAMANOR 803L 2.5% | None | 25° C. No burning | 30% | Ex-cellent |
| Em-bodi-ment 79 | undiluted solution B | TAMANOR 803L 3% | None | 25° C. No burning | 55% | Ex-cellent |
| Em-bodi-ment 80 | undiluted solution B | TAMANOR 803L 4% | None | 25° C. No burning | 60% | Ex-cellent |
| Em-bodi-ment 81 | undiluted solution C | TAMANOR 803L 2% | None | 25° C. No burning | 25% | Ex-cellent |
| Em-bodi-ment 82 | undiluted solution C | TAMANOR 803L 2.5% | None | 25° C. No burning | 30% | Ex-cellent |

TABLE 7-continued

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Em-bodi-ment 83 | undiluted solution C | TAMANOR 803L 3% | None | 25° C. No burning | 55% | Ex-cellent |
| Em-bodi-ment 84 | undiluted solution C | TAMANOR 803L 4% | None | 25° C. No burning | 60% | Ex-cellent |

Note:
TAMANOR803L is a goods name of terpenephenol resin manufactured by Arakawa Chemical Industry Ltd.

TABLE 8

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Em-bodi-ment 85 | undiluted solution A | TAMANOR 520S 2% | None | 25° C. No burning | 25% | Ex-cellent |
| Em-bodi-ment 86 | undiluted solution A | TAMANOR 520S 2.5% | None | 25° C. No burning | 30% | Ex-cellent |
| Em-bodi-ment 87 | undiluted solution A | TAMANOR 520S 3% | None | 25° C. No burning | 55% | Ex-cellent |
| Em-bodi-ment 88 | undiluted solution A | TAMANOR 520S 4% | None | 25° C. No burning | 60% | Ex-cellent |
| Em-bodi-ment 89 | undiluted solution B | TAMANOR 520S 2% | None | 25° C. No burning | 25% | Ex-cellent |
| Em-bodi-ment 90 | undiluted solution B | TAMANOR 520S 2.5% | None | 25° C. No burning | 30% | Ex-cellent |
| Em-bodi-ment 91 | undiluted solution B | TAMANOR 520S 3% | None | 25° C. No burning | 55% | Ex-cellent |
| Em-bodi-ment 92 | undiluted solution B | TAMANOR 520S 4% | None | 25° C. No burning | 60% | Ex-cellent |
| Em-bodi-ment 93 | undiluted solution C | TAMANOR 520S 2% | None | 25° C. No burning | 25% | Ex-cellent |
| Em-bodi-ment 94 | undiluted solution C | TAMANOR 520S 2.5% | None | 25° C. No burning | 30% | Ex-cellent |
| Em-bodi-ment 95 | undiluted solution C | TAMANOR 520S 3% | None | 25° C. No burning | 55% | Ex-cellent |
| Em-bodi-ment 96 | undiluted solution C | TAMANOR 520S 4% | None | 25° C. No burning | 60% | Ex-cellent |

Note:
TAMANOR526 and TAMANOR527S are alkylphenol rein manufactured by Arakawa Chemical Industry Ltd.

TABLE 9

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Em-bodi-ment 97 | undiluted solution A | Polyvinyl acetate 2% | None | 25° C. No burning | 25% | Ex-cellent |
| Em-bodi-ment 98 | undiluted solution A | Polyvinyl acetate 2.5% | None | 25° C. No burning | 30% | Ex-cellent |
| Em-bodi-ment 99 | undiluted solution A | Polyvinyl acetate 3% | None | 25° C. No burning | 55% | Ex-cellent |
| Em-bodi-ment 100 | undiluted solution A | Polyvinyl acetate 4% | None | 25° C. No burning | 60% | Ex-cellent |
| Em-bodi-ment 101 | undiluted solution B | Polyvinyl acetate 2% | None | 25° C. No burning | 25% | Ex-cellent |
| Em-bodi-ment 102 | undiluted solution B | Polyvinyl acetate 2.5% | None | 25° C. No burning | 30% | Ex-cellent |
| Em-bodi-ment 103 | undiluted solution B | Polyvinyl acetate 3% | None | 25° C. No burning | 55% | Ex-cellent |
| Em-bodi-ment 104 | undiluted solution B | Polyvinyl acetate 4% | None | 25° C. No burning | 60% | Ex-cellent |
| Em-bodi-ment 105 | undiluted solution C | Polyvinyl acetate 2% | None | 25° C. No burning | 25% | Ex-cellent |
| Em-bodi-ment 106 | undiluted solution C | Polyvinyl acetate 2.5% | None | 25° C. No burning | 30% | Ex-cellent |
| Em-bodi-ment 107 | undiluted solution C | Polyvinyl acetate 3% | None | 25° C. No burning | 55% | Ex-cellent |
| Em-bodi-ment 108 | undiluted solution C | Polyvinyl acetate 4% | None | 25° C. No burning | 60% | Ex-cellent |

TABLE 10

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Em-bodi-ment 109 | undiluted solution A | Cyclo-hexane reain 2% | None | 25° C. No burning | 25% | Ex-cellent |
| Em-bodi-ment 110 | undiluted solution A | Cyclo-hexane reain 2.5% | None | 25° C. No burning | 30% | Ex-cellent |
| Em-bodi-ment 111 | undiluted solution A | Cyclo-hexane reain 3% | None | 25° C. No burning | 55% | Ex-cellent |
| Em-bodi-ment 112 | undiluted solution A | Cyclo-hexane reain 4% | None | 25° C. No burning | 60% | Ex-cellent |
| Em-bodi-ment 113 | undiluted solution B | Cyclo-hexane reain 2% | None | 25° C. No burning | 25% | Ex-cellent |

TABLE 10-continued

| | Type of undiluted solution of positive type photo-sensitive com-position | Type and inclution rate of close auxiliary agent | Rate of solid element in deve-eloping promot-ing agent | Burning temper-ature No burning | Humi-dity | Cloth fitness |
|---|---|---|---|---|---|---|
| Em-bodi-ment 114 | undiluted solution B | Cyclo-hexane reain 2.5% | None | 25° C. No burning | 30% | Ex-cellent |
| Em-bodi-ment 115 | undiluted solution B | Cyclo-hexane reain 3% | None | 25° C. No burning | 55% | Ex-cellent |
| Em-bodi-ment 116 | undiluted solution B | Cyclo-hexane reain 4% | None | 25° C. No burning | 60% | Ex-cellent |
| Em-bodi-ment 117 | undiluted solution C | Cyclo-hexane reain 2% | None | 25° C. No burning | 25% | Ex-cellent |
| Em-bodi-ment 118 | undiluted solution C | Cyclo-hexane reain 2.5% | None | 25° C. No burning | 30% | Ex-cellent |
| Em-bodi-ment 119 | undiluted solution C | Cyclo-hexane reain 3% | None | 25° C. No burning | 55% | Ex-cellent |
| Em-bodi-ment 120 | undiluted solution C | Cyclo-hexane reain 4% | None | 25° C. No burning | 60% | Ex-cellent |
| Em-bodi-ment 121 | undiluted solution A | Cyclo-hexane reain 2% | None | 25° C. No burning | 25% | Ex-cellent |
| Em-bodi-ment 122 | undiluted solution A | Cyclo-hexane reain 2.5% | None | 25° C. No burning | 30% | Ex-cellent |
| Em-bodi-ment 123 | undiluted solution A | Cyclo-hexane reain 3% | None | 25° C. No burning | 55% | Ex-cellent |
| Em-bodi-ment 124 | undiluted solution A | Cyclo-hexane reain 4% | None | 25° C. No burning | 60% | Ex-cellent |
| Em-bodi-ment 125 | undiluted solution B | Cyclo-hexane reain 2% | None | 25° C. No burning | 25% | Ex-cellent |
| Em-bodi-ment 126 | undiluted solution B | Cyclo-hexane reain 2.5% | None | 25° C. No burning | 30% | Ex-cellent |
| Em-bodi-ment 127 | undiluted solution B | Cyclo-hexane reain 3% | None | 25° C. No burning | 55% | Ex-cellent |
| Em-bodi-ment 128 | undiluted solution B | Cyclo-hexane reain 4% | None | 25° C. No burning | 60% | Ex-cellent |
| Em-bodi-ment 129 | undiluted solution C | Cyclo-hexane reain 2% | None | 25° C. No burning | 25% | Ex-cellent |
| Em-bodi-ment 130 | undiluted solution C | Cyclo-hexane reain 2.5% | None | 25° C. No burning | 30% | Ex-cellent |
| Em-bodi-ment 131 | undiluted solution C | Cyclo-hexane reain 3% | None | 25° C. No burning | 55% | Ex-cellent |
| Em-bodi-ment 132 | undiluted solution C | Cyclo-hexane reain 4% | None | 25° C. No burning | 60% | Ex-cellent |

As described above, the fact that the positive-type photosensitive composition not including vinylpyrrolidone/dimethylaminoethylmethacrylate copolymers or polyvinylbutyral and the like does not produce any developing latitude, but the positive-type photosensitive composition including vinylpyrrolidone/dimethylaminoethylmethacrylate copolymers or polyvinylbutyral and the like produces any developing latitude shows that strong adhesion of vinylpyrrolidone/dimethylaminoethylmethacrylate copolymers or polyvinylbutyral and the like properly reinforces weak adhesion of alkaline soluble organic polymer substance having a phenolic hydroxy group and becomes a cause for producing a developing latitude.

Developing Latitude of Comparative Examples

As shown in Table 11, a burning temperature at the photosensitive film of the positive-type photosensitive composition having titanium organic compound added to undiluted solution of the positive-type photosensitive composition composed of alkaline soluble organic polymer substance with phenolic hydroxy group and phthalocyanine pigment could be remarkably decreased.

In the case of the photosensitive film of the positive-type photosensitive composition added with titanium organic compound, the film could be formed well even under a buring temperature of 46° C., its sensitivity became superior and the developing operation could be easily carried out.

However, the test not performing any burning processing could not produce any superior film and the developing became poor.

TABLE 11

| | Type of undiluted solution of positive type photo-sensitive com-position | Type and inclution rate of close auxiliary agent | Rate of solid element in deve-eloping promot-ing agent | Burning temper-ature No burning | Cloth fitness |
|---|---|---|---|---|---|
| Comparative Example 1 | undiluted solution A | Orgatex TA-10 1% | None | 46° C. | Ex-cellent |
| Comparative Example 2 | undiluted solution A | Orgatex TA-25 1% | None | 46° C. | Ex-cellent |
| Comparative Example 3 | undiluted solution A | Orgatex TA-22 1% | None | 46° C. | Ex-cellent |
| Comparative Example 4 | undiluted solution A | Orgatex TPHS 1% | None | 46° C. | Ex-cellent |
| Comparative Example 5 | undiluted solution A | Orgatex TA-100 1% | None | 46° C. | Ex-cellent |
| Comparative Example 6 | undiluted solution B | Orgatex TA-10 1% | None | 46° C. | Ex-cellent |
| Comparative Example 7 | undiluted solution B | Orgatex TA-25 1% | None | 46° C. | Ex-cellent |
| Comparative Example 8 | undiluted solution B | Orgatex TA-100 1% | None | 46° C. | Ex-cellent |
| Comparative Example 9 | undiluted solution C | Orgatex TA-10 1% | None | 46° C. | Ex-cellent |
| Comparative Example 10 | undiluted solution C | Orgatex TA-25 1% | None | 46° C. | Ex-cellent |
| Comparative Example 11 | undiluted solution C | Orgatex TA-100 1% | None | 46° C. | Ex-cellent |
| Comparative Example 12 | undiluted solution D | Orgatex TA-10 1% | None | 46° C. | Ex-cellent |
| Comparative Example 13 | undiluted solution D | Orgatex TA-25 1% | None | 46° C. | Ex-cellent |
| Comparative Example 14 | undiluted solution D | Orgatex TA-100 1% | None | 46° C. | Ex-cellent |

TABLE 11-continued

| | Type of undiluted solution of positive type photo-sensitive com-position | Type and inclution rate of close auxiliary agent | Rate of solid element in deve-eloping promot-ing agent | Burning temper-ature No burning | Cloth fitness |
|---|---|---|---|---|---|
| Comparative Example 15 | undiluted solution A | Orgatex TA-10 1% | None | 25° C. No burning | Poor |
| Comparative Example 16 | undiluted solution A | Orgatex TA-25 1% | None | 25° C. No burning | Poor |
| Comparative Example 17 | undiluted solution B | Orgatex TA-10 1% | None | 25° C. No burning | Poor |
| Comparative Example 18 | undiluted solution B | Orgatex TA-25 1% | None | 25° C. No burning | Poor |
| Comparative Example 19 | undiluted solution C | Orgatex TA-10 1% | None | 25° C. No burning | Poor |
| Comparative Example 20 | undiluted solution C | Orgatex TA-25 1% | None | 25° C. No burning | Poor |
| Comparative Example 21 | undiluted solution D | Orgatex TA-10 1% | None | 25° C. No burning | Poor |
| Comparative Example 22 | undiluted solution D | Orgatex TA-25 1% | None | 25° C. No burning | Poor |

Note:
Orgatex is a products name of titanium organic compound manufactured by Arakawa Chemical Industry Ltd.
Orgatex TA-10 is a tetraisopropyltitanite.
Orgatex TA-25 is a tetranormaltitanite.
Orgatex TA-100 is a tetaniumacetylacetonate.
Orgatex TPHS is polyhydroxytitaniumsterate.

In reference to the aforesaid results, the following effects can be attained in the photogravure plate making method when the positive-type photosensitive composition not requiring any burning operation after coating is used:

(1) Burning after coating of a photogravure-plated item is not suitable and it has a characteristic capable of attaining a requisite and sufficient adhesion state even if the burning is not carried out. A photosensitive film having luster and quite hard state can be attained.

(2) A requisite and sufficient adhesion can be attained when the coating is carried out on a fine day showing a humidity of about 25 to 60% in a working room, or the coating is carried out with a humidity of 25 to 60% in the working room under application of the dehumidifying device and the humidifying device.

(3) A superior alkaline developing not producing any residuals can be carried out in a suitable time. Irrespective of the fact that the component at the photosensitive layer does not produce substantially any chemical change by exposure, all the basic performances of a printing plate such as an plate wear characteristic, sensitivity and developing latitude or the like can be satisfied.

(4) Even if the image exposure is carried out with a lower exposure energy rather than with a higher exposure energy in which excessive heat is generated by the photo-thermal conversion substance in the photosensitive layer, the developing latitude can be set wide, so that a degree of dispersion generated at the photosensitive layer is well restricted low and there occurs no problem that the photosensitive layer is dispersed and the optical system in the exposure device is contaminated.

(5) No burning processing enables a quite superior developing to be carried out where a high sensitivity can be kept, and an edge of the resist image is cut in a sharp contour strictly in accordance with an exposure radiation pattern.

(6) A quite superior developing can be carried out while a film reduction is scarcely produced. It is possible to avoid occurrence of pinholes caused by film reduction.

(7) The resist image has a luster, a quite hard resist image capable of printing several thousand copies can be attained during printing as it is, and anti-scar characteristic in handling before developing operation after forming the photosensitive film is improved.

(8) A printing of image with laser and developing latitude are superior.

In the present invention, what type of material quality is applied to the printing surface can be determined in reference to a relation of the number of printed sheets or photogravure plate making cost. In the case that the number of printing sheets is long such as 50,000 meter, for example, a nickel-phosphor alloy plating capable of being quenched is applied to the roll, the roll is heated at 400° C. for one minute by a high frequency quenching device and the like, its heat is radiated to perform the quenching operation, or a hard chromium plating is applied. Further, when the number of printing sheet is high such as 100,000 to 300,000 meter in length, a chromium is peeled off at the time when the chromium plating thickness becomes 3 $\mu$m, for example, the chromium plating is applied and a printing can be continued. In turn, when the number of printing is less in thousand to several thousand meter in length, for example, chromium plating is not carried out, printing can be performed by a printing surface formed with cells in copper sulfate plating, or the aforesaid alkaline developing is carried out, a photosensitive film forming resin at the exposed part is washed away with water, and the printing can be carried out with ink containing solvent not dissoluting the resist by the printing plate while only the resist at the non-image line part is left.

In addition, in the present invention, what type of material quality is applied to the printing surface is not limited to the aforesaid copper sulfate plating, but copper plating, nickel plating, nickel alloy plating or zinc plating may also be applicable, and at this time, it is necessary to provide a desired plating device in place of the copper sulfate plating device 13 shown in FIG. 1 and further corrosion liquid in the corrosion device is also required to be replaced with desired corrosion liquid.

What is claimed is:

1. A photogravure plate making method, wherein (A) an upper end of a vertical coating pipe is placed near below one end of a photogravure plated roll chucked at both ends in a horizontal state and rotated, (B) said coating pipe is moved up to the other end of the photogravure plated roll, (C) a positive-type photosensitive agent composed of alkaline soluble positive-type photosensitive composition having an infrared wavelength range laser sensitivity with a developing latitude where image line part exposed by the alkaline developing liquid is washed away and a non-image line part not exposed is not washed away under non-heating after forming a coated film at one end is slightly bulged out and overflown of an upper end of said coating pipe, (D) the photogravure plated roll is coated through a spiral coating system, (E) upon completion of coating operation, the rotation of the photogravure plated roll is continued to form a natural dried coating film, then the photogravure plated roll is rotated at a speed which (1) disperse the residual solvent in the coated film into the air, (2) reduce a concentration of the residual solvent and (3) form a photosensitive film, and subsequently, (F) a positive image is exposed with an infrared wavelength range laser against the photosensitive film, (G) either main chain or side chain of the molecules of photosensitive film forming resin at said exposed part is cut to cause it to become a lower molecule having more increased alkaline solubility, (H) a latent image having a photosensitive layer ablation is formed, then (I) alkaline development is carried out, and (J) the photosensitive film forming resin at the exposed part is washed away to leave only the resist at the non-image line.

2. The photogravure plate making method according to claim 1, wherein said positive-type photosensitive composition comprises alkaline soluble organic high molecular substance including epoxy resin having phenolic hydroxyl group or reacted with phenolic hydroxyl group and photothermal conversion substance for absorbing infrared rays of an image exposing light source and converting it into heat, and as adherence characteristic reforming agents, the composition includes any one of (1) vinyl pyrrolidone/vinylacetate copolymers (2) polyvinylbutyral (3) styrene/maleic acid copolymers (4) vinylpyrrolidone/dimethylaminoethylmethacrylate copolymers (5) terpolymers of vinylpyrrolidone/vinylcaprolactam/dimetylaminoetylmethacrylate (6) terpenephenolic resin (7) alkylphenolic resin (8) polyvinylformal resin (9) melamine/formaldehyde resin

(10) polyvinyl acetate, and

(11) ketone resin.

3. The photogravure plate making method according to claim 1, wherein a surface of the photogravure plated roll is wiped off to clean with a wiping cloth before the positive-type photosensitive agent is coated on the photogravure plated roll.

4. The photogravure plate making method according to claim 1, wherein a surface of the photogravure plated roll for forming a photosensitive film by coating said positive-type photosensitive agent is copper, copper sulfate plating, nickel plating, nickel alloy plating or zinc plating.

5. The photogravure plate making method according to claim 1, wherein said alkaline developing operation is carried out to wash away the photosensitive film forming resin at an exposed part and to leave only the resist at the non-image line part, and an etching is then carried out to form a cell and subsequently, the resist is peeled off with stronger alkaline developing liquid to form a plated surface.

6. The photogravure plate making method according to claim 1, wherein the plated surface has a hard film for applying an plate wear such as a chromium plating or a nickel alloy plating enabling a quenching or ceramics after said resist is peeled off.

* * * * *